(12) United States Patent
McLean et al.

(10) Patent No.: US 10,407,945 B2
(45) Date of Patent: Sep. 10, 2019

(54) MULTI-POINT LOCKING MECHANISM

(71) Applicant: EVERSAFE EUROPE LIMITED, Dublin (IE)

(72) Inventors: Hugh David Geoffrey McLean, Scarva (GB); Niall English, Dublin (IE)

(73) Assignee: EVERSAFE EUROPE LIMITED, Dublin (IE)

( * ) Notice: Subject to any disclaimer, the term of this patent is extended or adjusted under 35 U.S.C. 154(b) by 0 days.

(21) Appl. No.: 15/997,911

(22) Filed: Jun. 5, 2018

(65) Prior Publication Data

US 2018/0283053 A1 Oct. 4, 2018

Related U.S. Application Data

(63) Continuation-in-part of application No. 15/928,219, filed on Mar. 22, 2018, now Pat. No. 10,376,032,
(Continued)

(51) Int. Cl.

| | |
|---|---|
| *E05B 65/52* | (2006.01) |
| *H05K 5/02* | (2006.01) |
| *F41C 33/06* | (2006.01) |
| *E05B 53/00* | (2006.01) |
| *A45C 13/18* | (2006.01) |
| *E05B 37/02* | (2006.01) |

(Continued)

(52) U.S. Cl.
CPC ............ *E05B 65/52* (2013.01); *E05B 53/003* (2013.01); *F41C 33/06* (2013.01); *H05K 5/0208* (2013.01); *A45C 13/18* (2013.01); *E05B 17/04* (2013.01); *E05B 35/08* (2013.01); *E05B 37/02* (2013.01); *E05B 47/0002* (2013.01); *E05B 63/14* (2013.01); *E05B 73/0011* (2013.01); *E05B 2063/0039* (2013.01); *G07C 9/00071* (2013.01); *G07C 9/00111* (2013.01); *G07C 9/00182* (2013.01); *G07C 9/00563* (2013.01); *G07C 2009/0092* (2013.01); *G07C 2009/00769* (2013.01)

(58) Field of Classification Search
CPC ........ B65D 25/22; B65D 55/14; A63B 55/00; A47B 81/00; A45C 13/10
USPC ..... 340/5.22, 545.6, 568.1; 70/269, 238, 63, 70/250, 25
See application file for complete search history.

(56) References Cited

U.S. PATENT DOCUMENTS 3,767,280 A * 10/1973 McLaughlin ......... E05B 65/462
312/219
3,776,007 A * 12/1973 Himsl ................... E05B 65/462
292/215
(Continued)

FOREIGN PATENT DOCUMENTS

WO 2016176694 11/2016

OTHER PUBLICATIONS

Search Report and Written Opinion of corresponding International Application No. PCT/EP2018/064800 dated Sep. 19, 2018.

*Primary Examiner* — Nam V Nguyen
(74) *Attorney, Agent, or Firm* — Reed Smith LLP

(57) ABSTRACT

A system for providing securement of a plurality of secure portable encasements including one or more encasements each configured to engage, and subsequently disengage, inseparable interaction with a common docking unit; and one or more common docking units, wherein the one or more encasements each has a multi-point locking system.

8 Claims, 43 Drawing Sheets

Related U.S. Application Data which is a continuation of application No. 15/429,404, filed on Feb. 10, 2017, now Pat. No. 9,955,763.

(60) Provisional application No. 62/518,832, filed on Jun. 13, 2017, provisional application No. 62/560,716, filed on Sep. 20, 2017, provisional application No. 62/295,564, filed on Feb. 16, 2016.

(51) Int. Cl.
*E05B 73/00* (2006.01)
*E05B 35/08* (2006.01)
*G07C 9/00* (2006.01)
*E05B 47/00* (2006.01)
*E05B 63/14* (2006.01)
*E05B 17/04* (2006.01)
*E05B 63/00* (2006.01)

(56) References Cited

U.S. PATENT DOCUMENTS

| | | | |
|---|---|---|---|
| 4,890,466 A * | 1/1990 | Cislo | F41C 33/06 |
| | | | 109/51 |
| 5,881,584 A | 3/1999 | Brunoski et al. | |
| 6,030,019 A * | 2/2000 | Stiltner | B62D 33/037 |
| | | | 292/39 |
| 6,378,344 B1 * | 4/2002 | Gartner | E05B 47/0657 |
| | | | 70/213 |
| 6,698,258 B2 * | 3/2004 | Westwinkel | E05B 65/462 |
| | | | 292/215 |
| 9,151,078 B2 * | 10/2015 | Lackey | E05B 63/143 |
| 9,423,211 B2 * | 8/2016 | Ho | F41C 33/06 |
| 9,970,215 B2 * | 5/2018 | Risi | G07C 9/00 |
| 2006/0065027 A1 * | 3/2006 | Valentine | E05B 47/0657 |
| | | | 70/278.1 |
| 2011/0203328 A1 | 8/2011 | Vilkomirski et al. | |
| 2015/0047397 A1 | 2/2015 | Lackey | |
| 2016/0123701 A1 | 5/2016 | Ho | |

\* cited by examiner

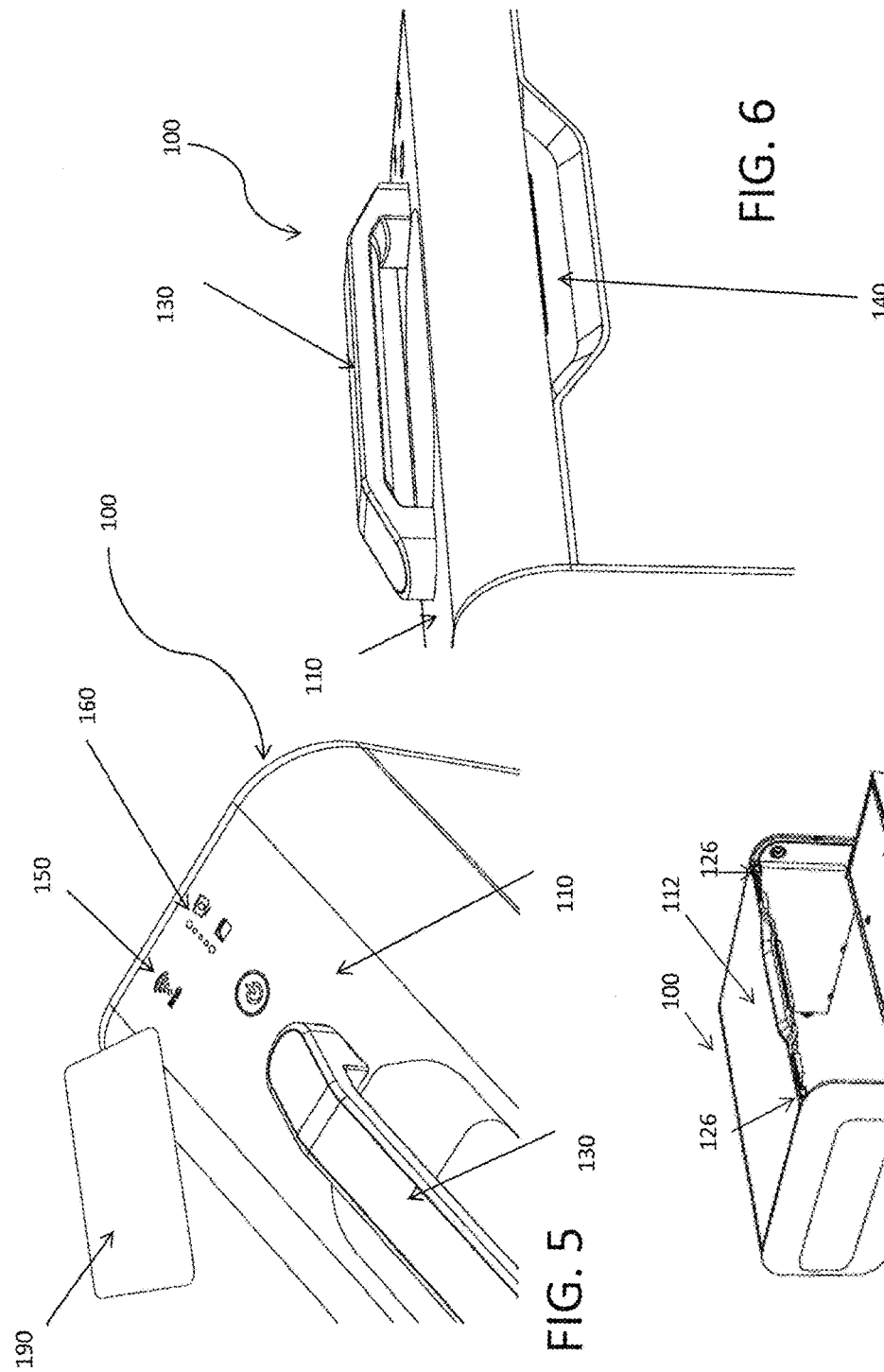

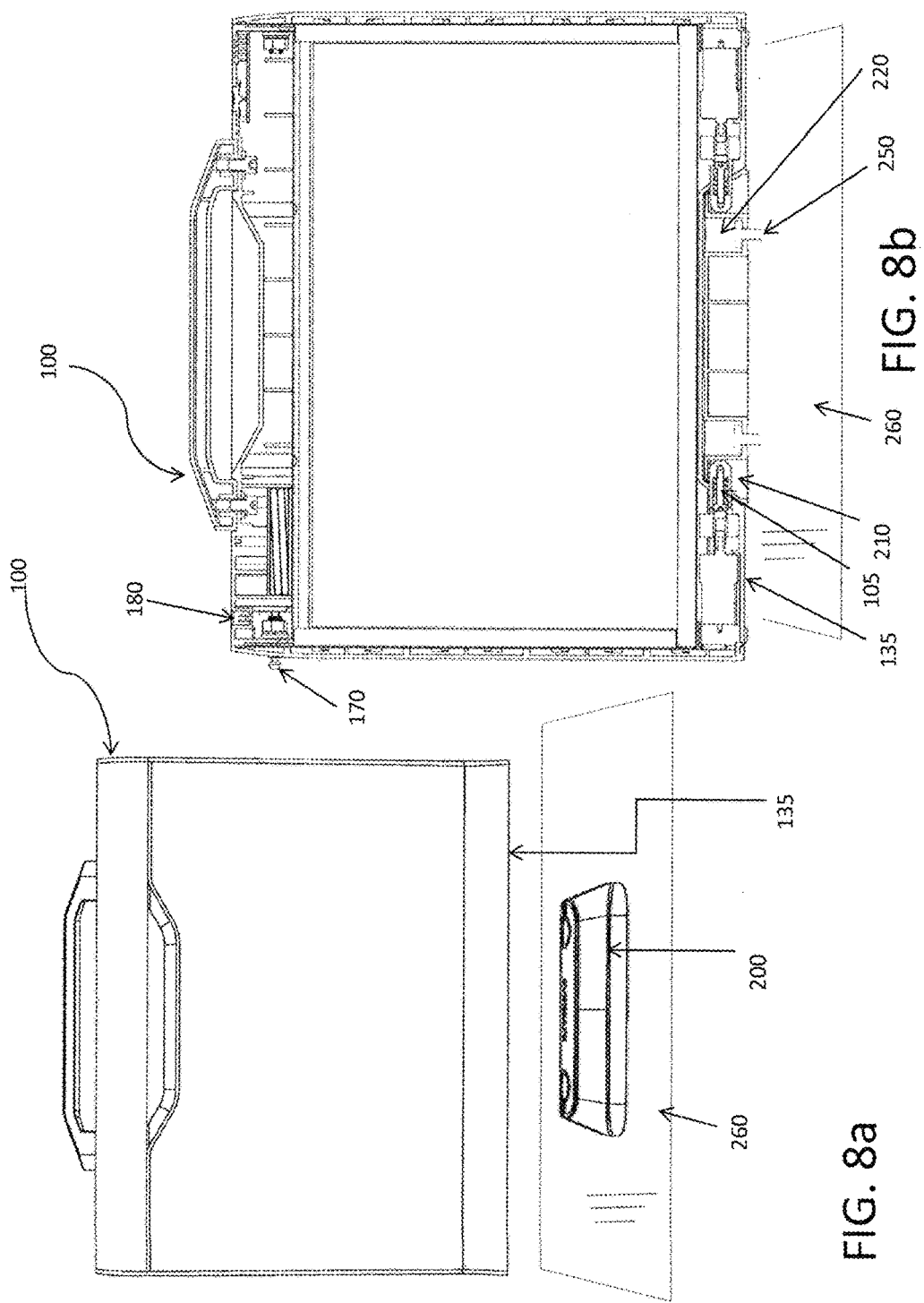

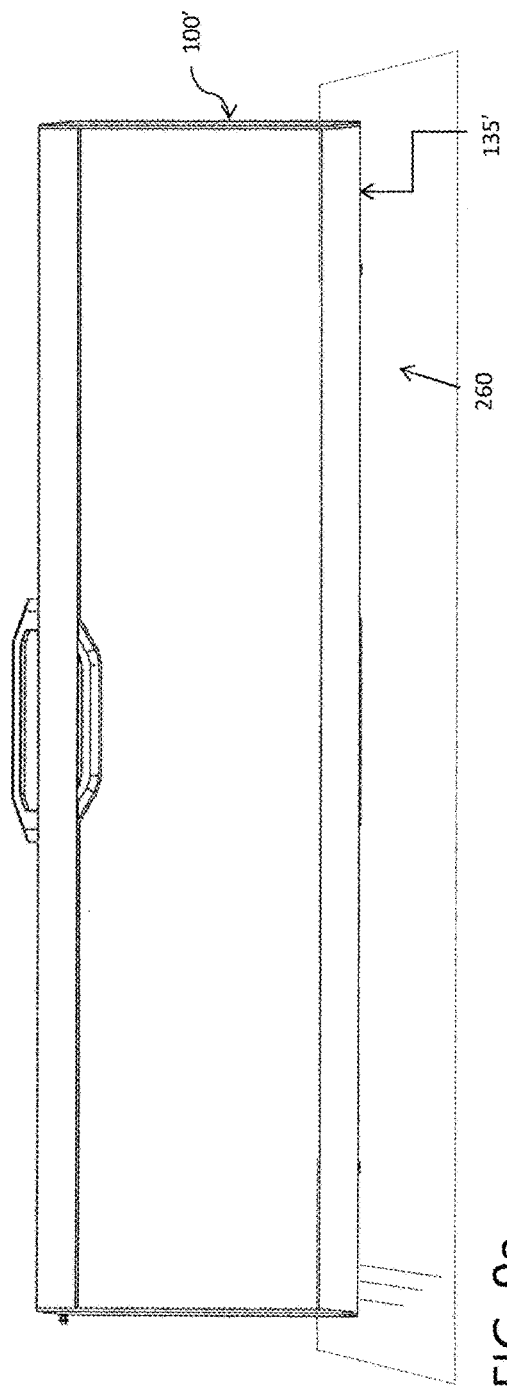
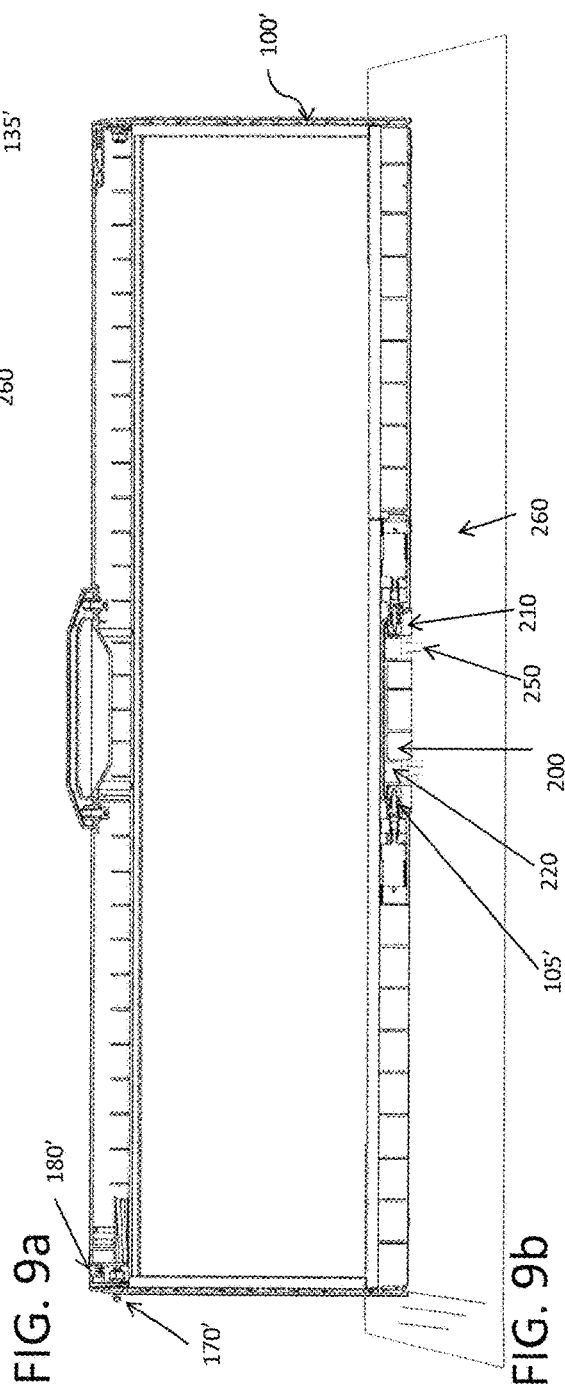
FIG. 9a
FIG. 9b

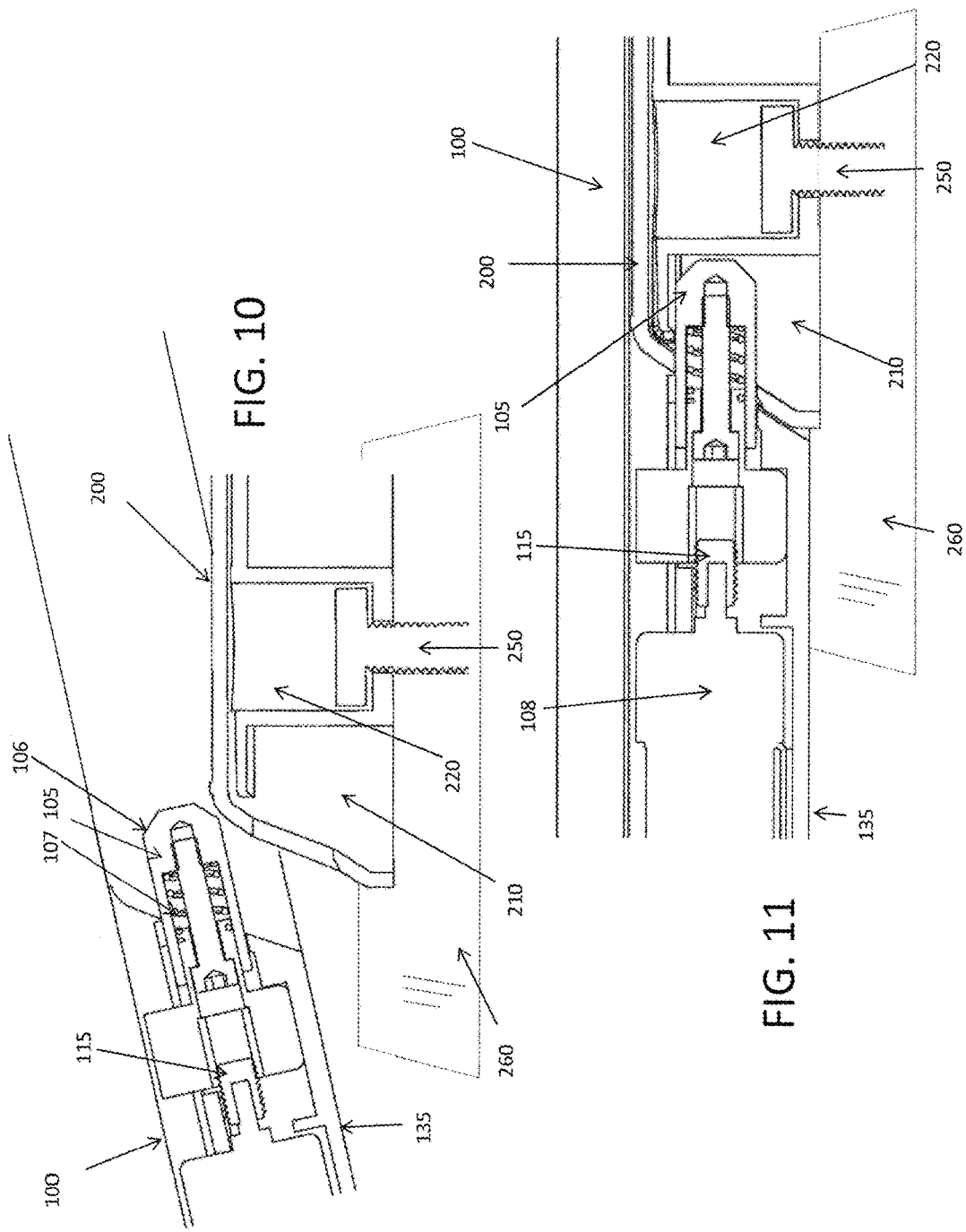

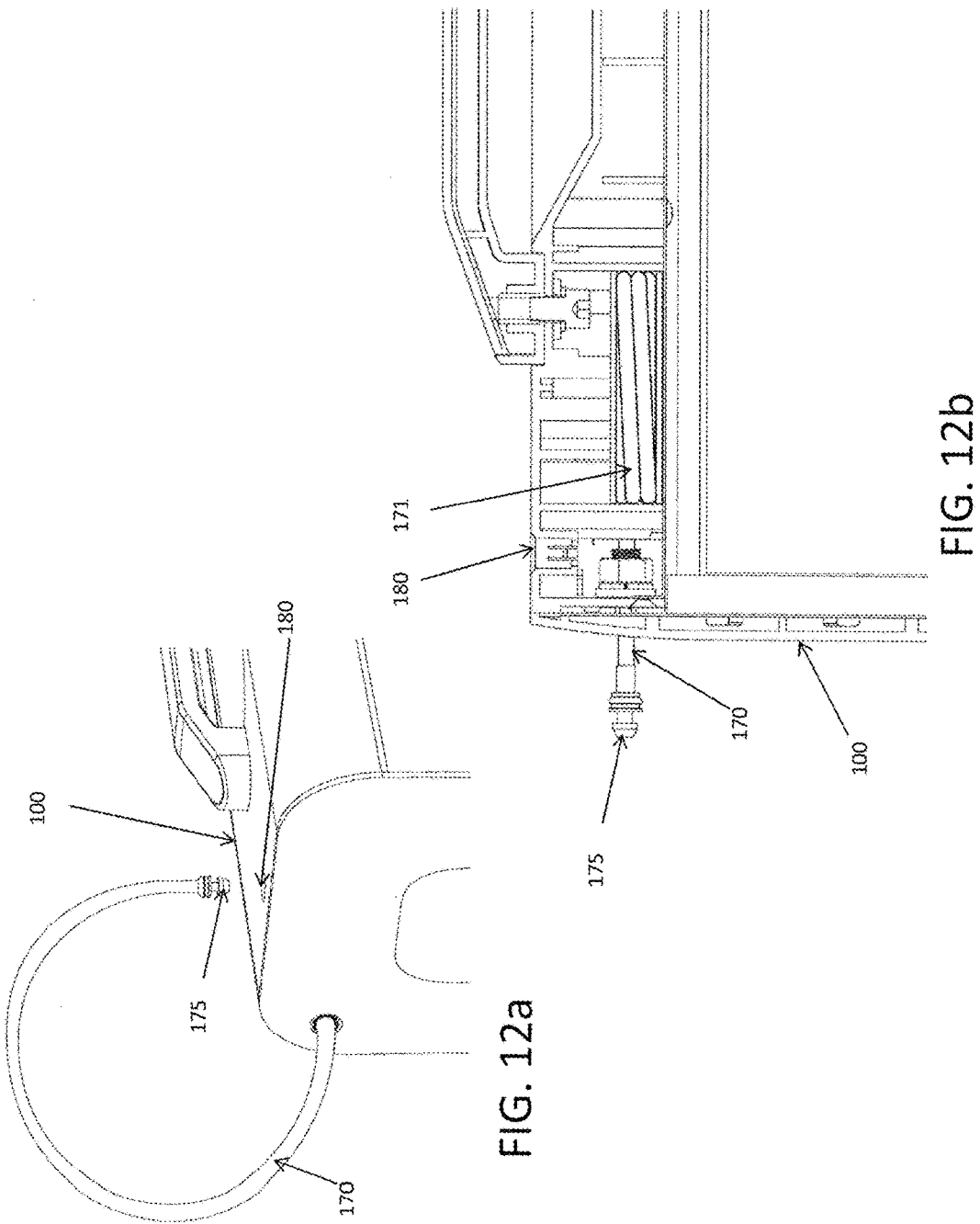

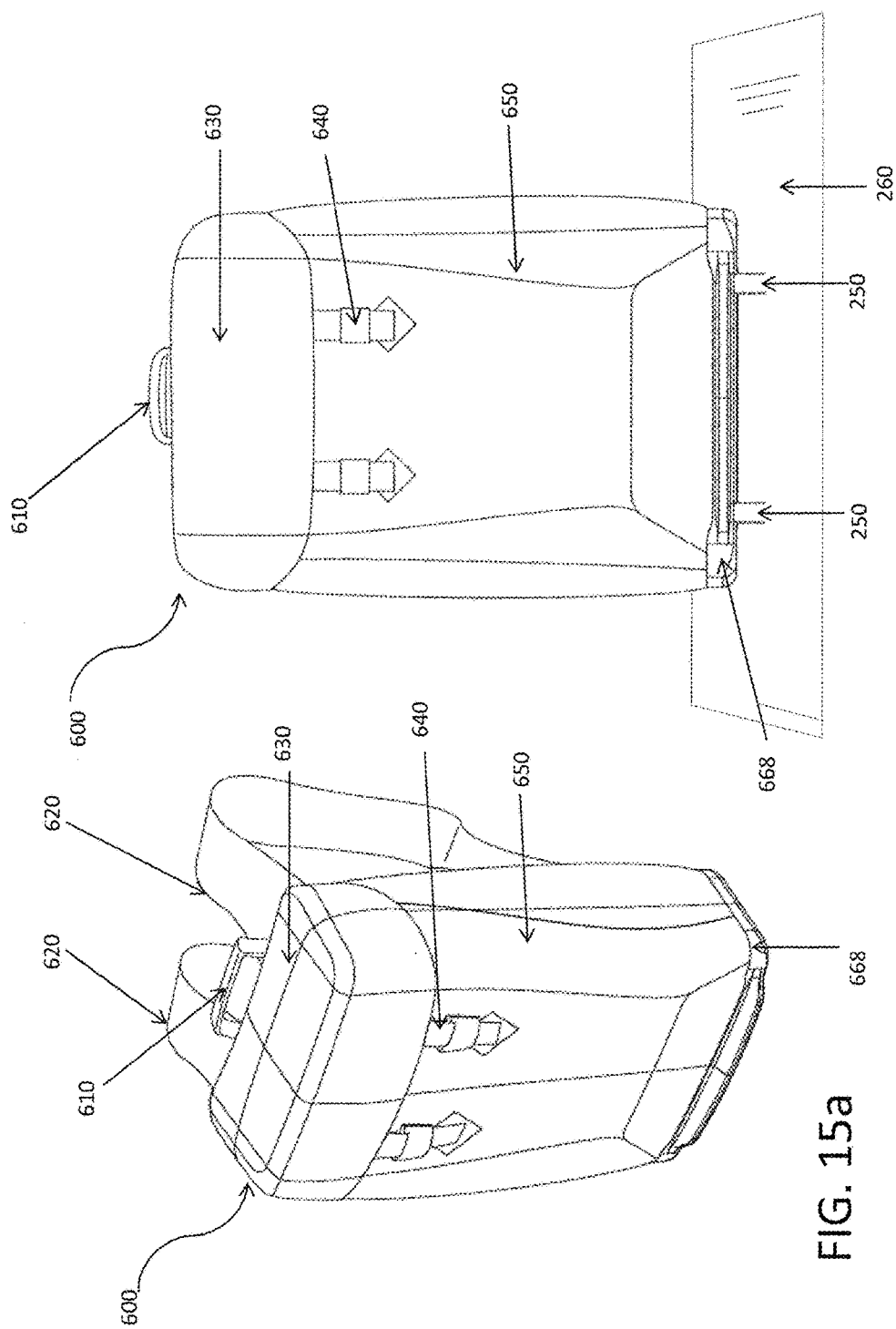

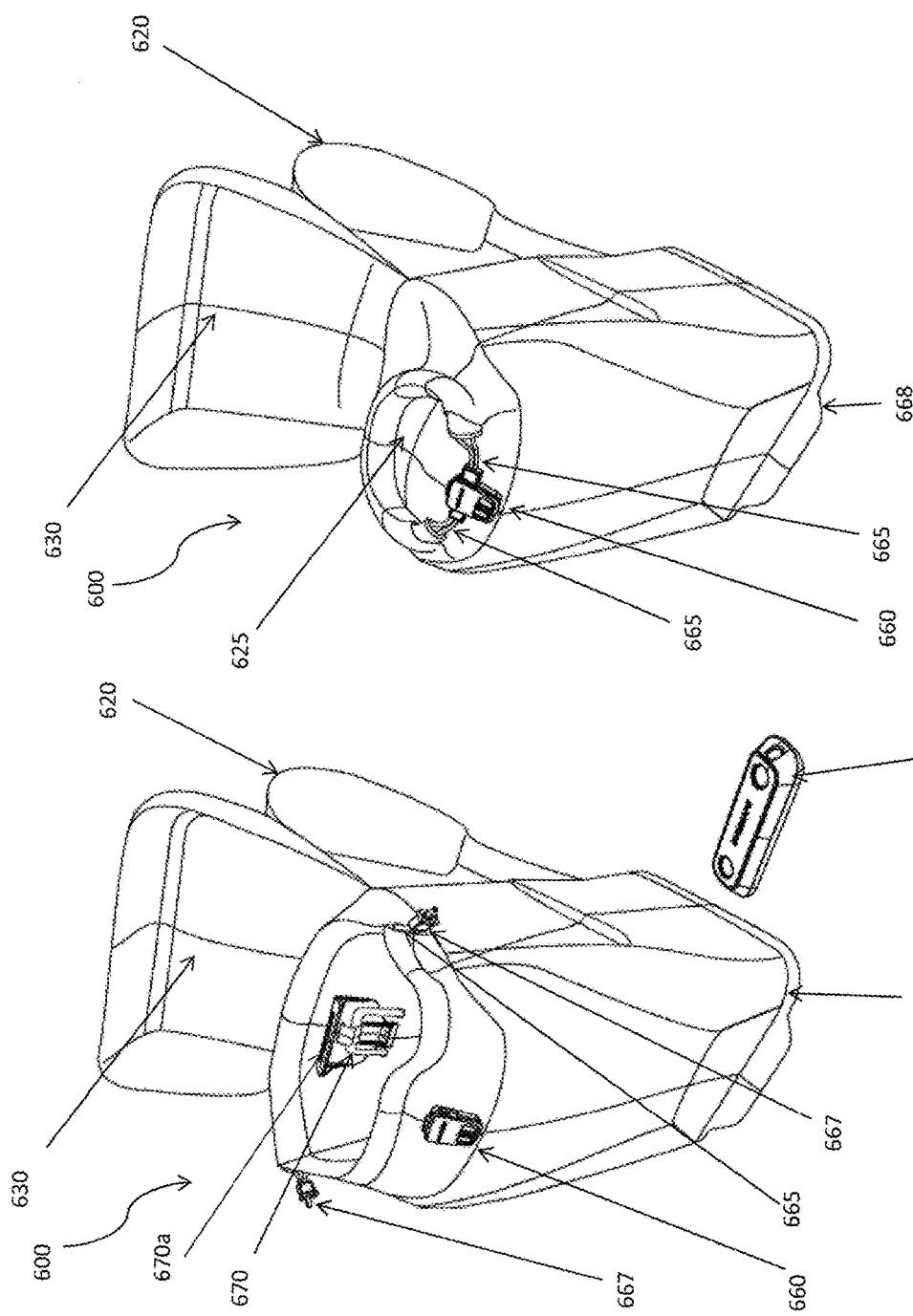

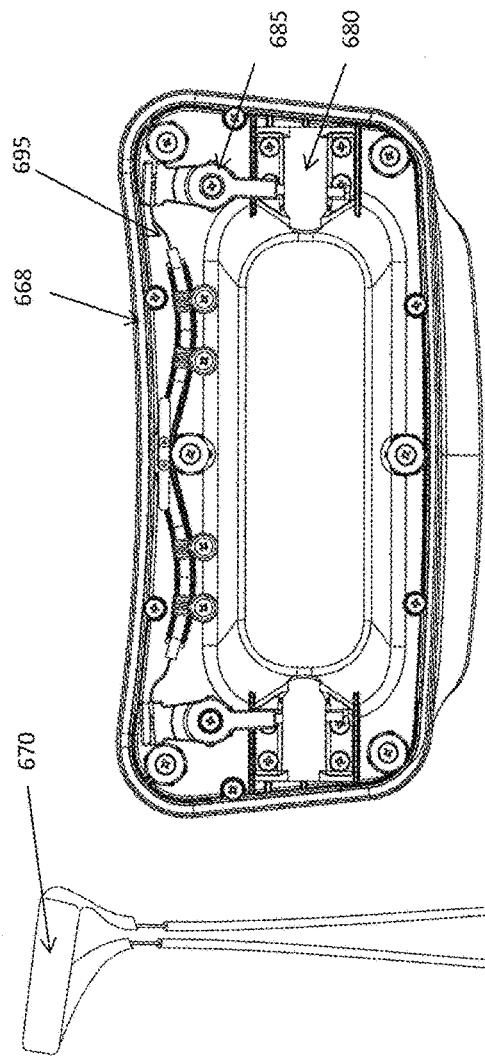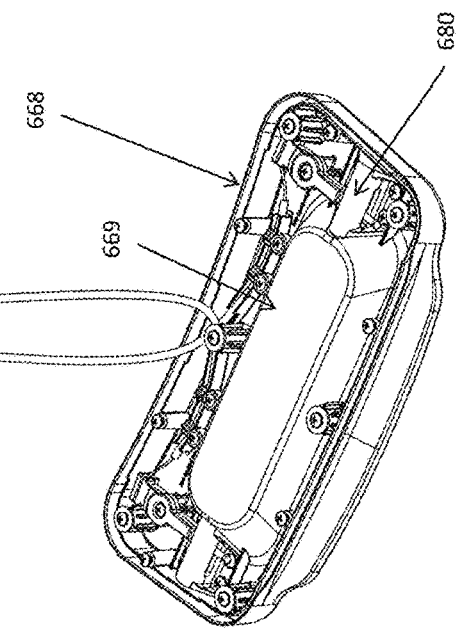
FIG. 17b
FIG. 17a

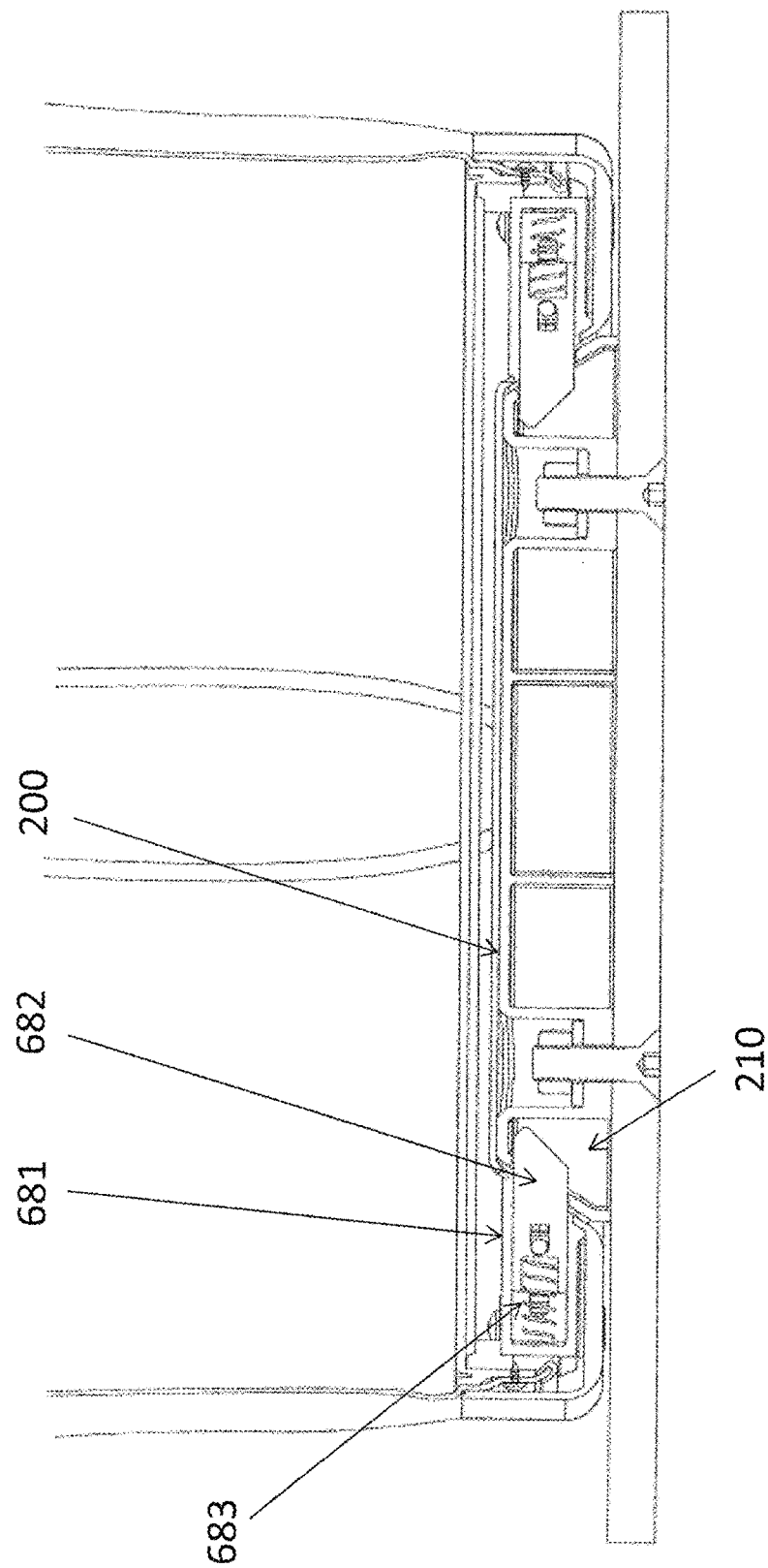

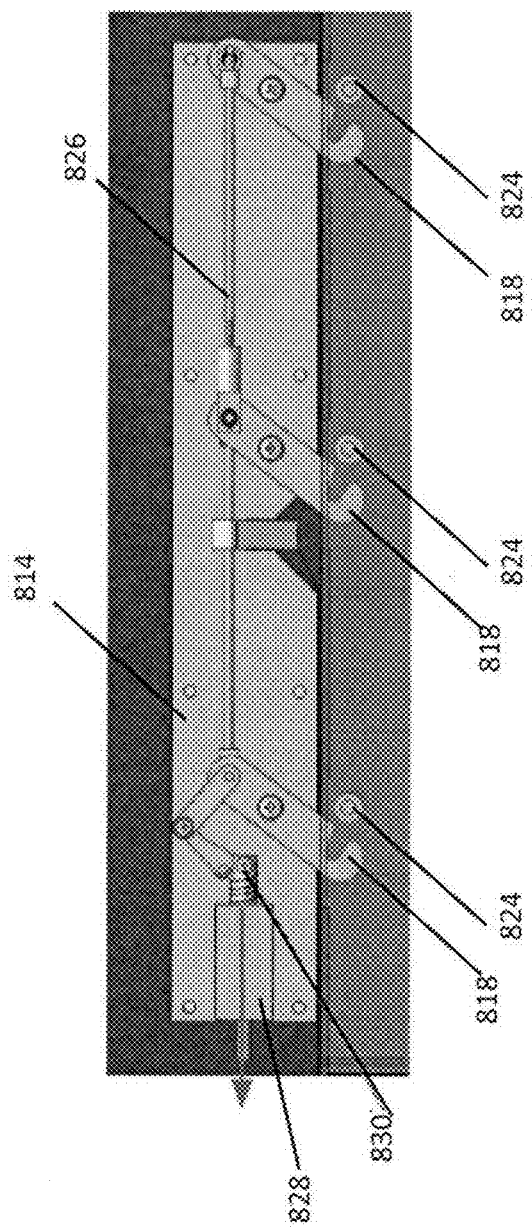

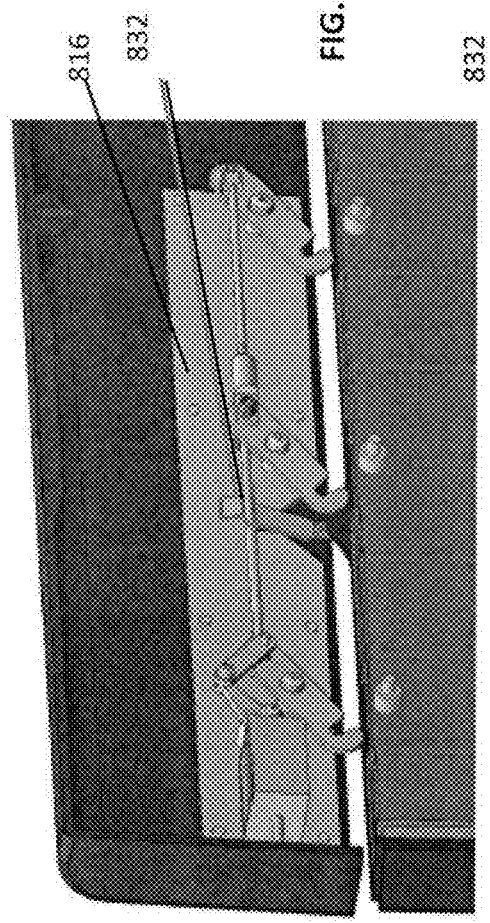
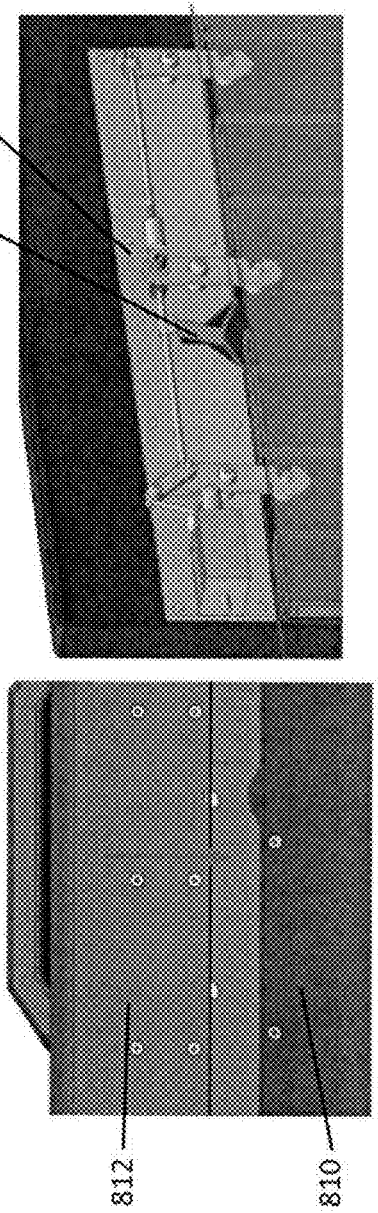
FIG. 25A
FIG. 25B
FIG. 25C

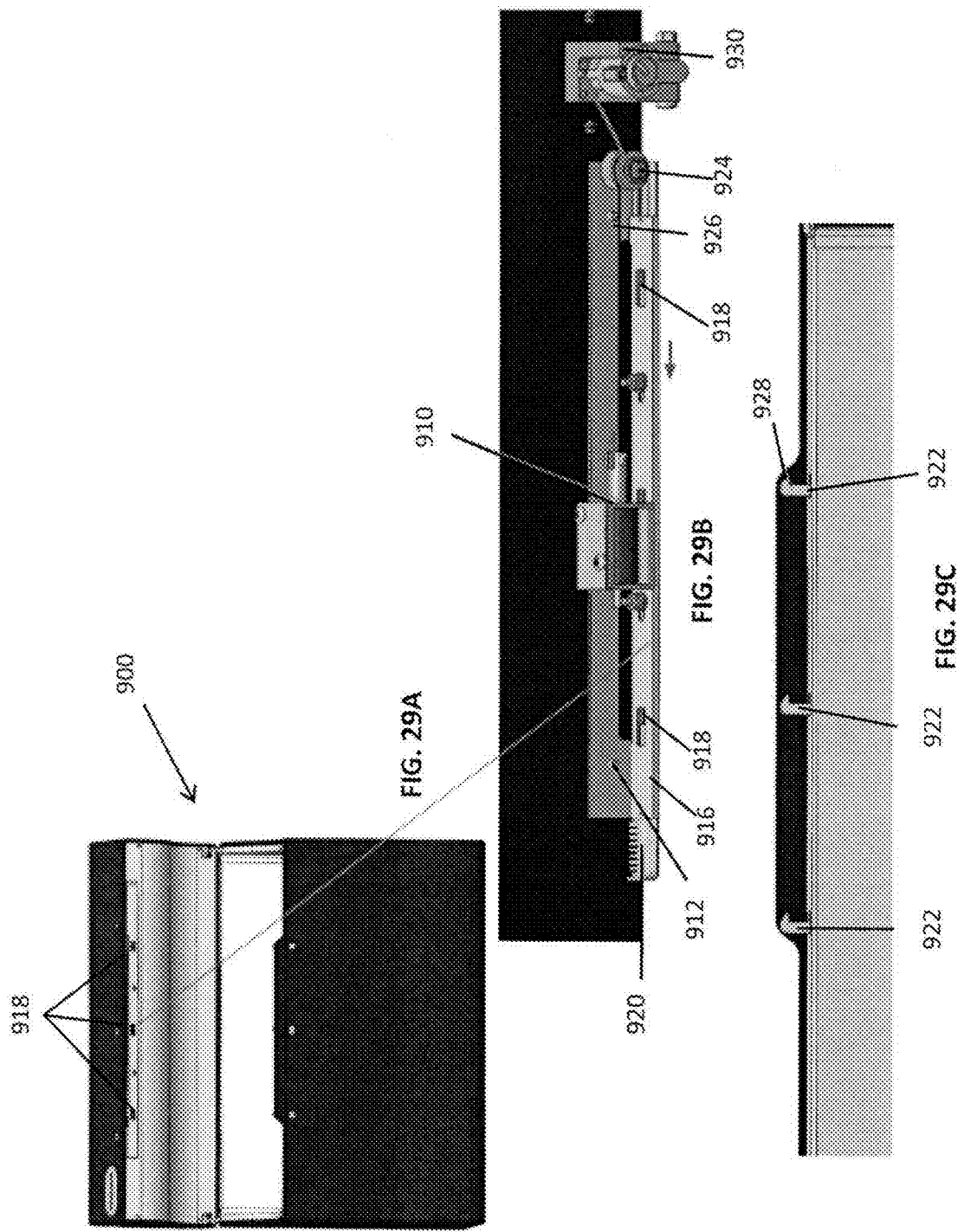

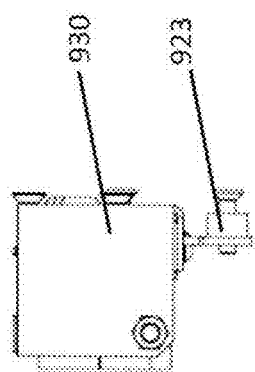

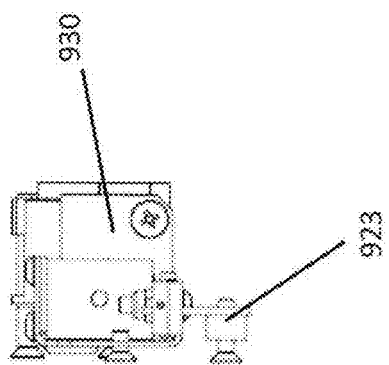

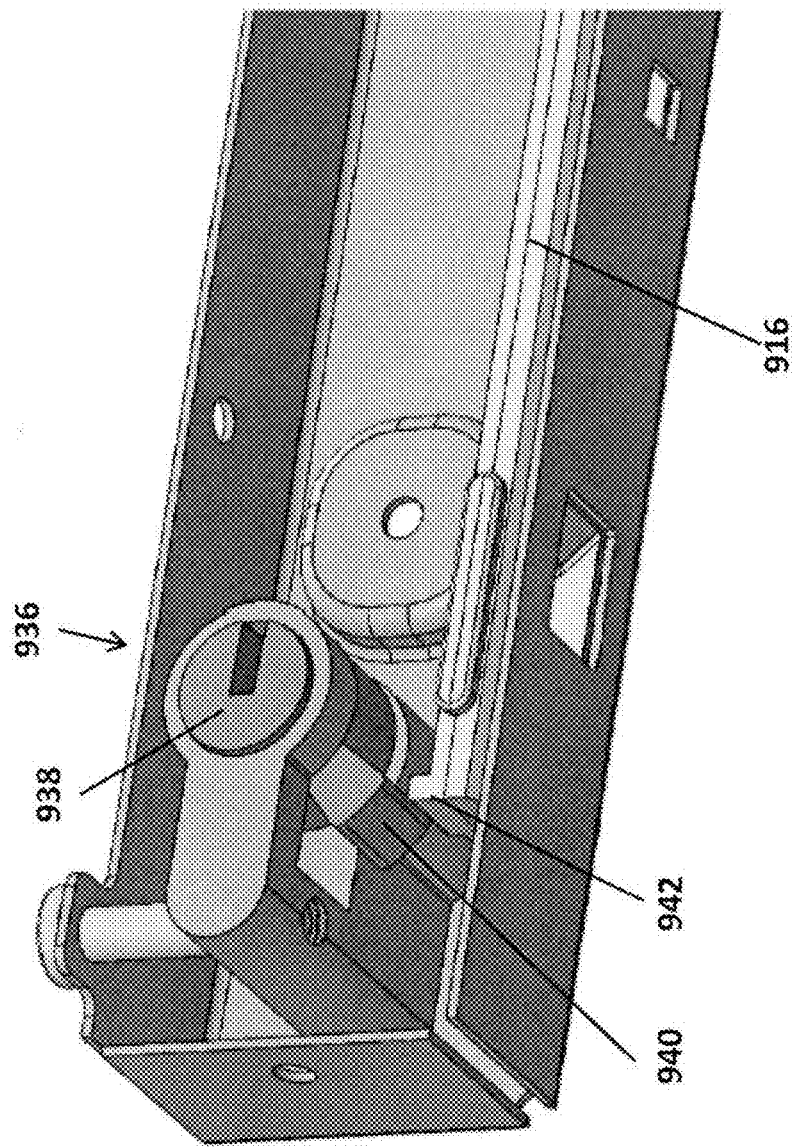

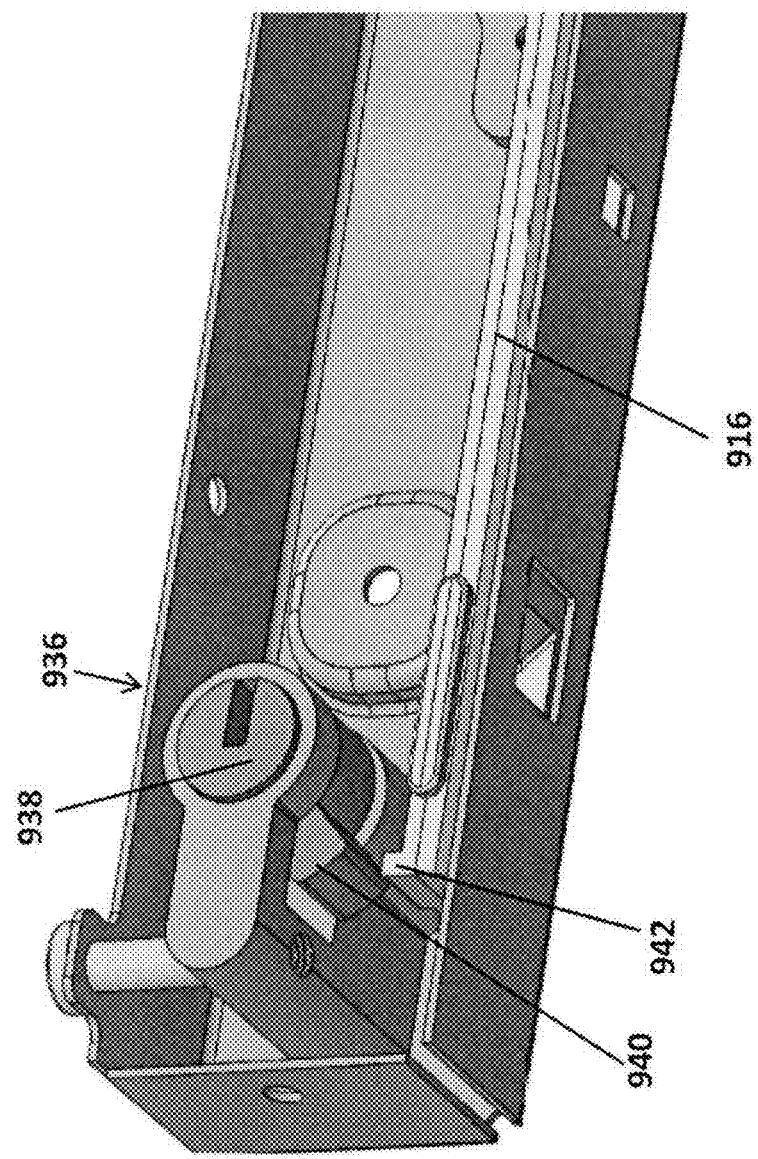

MULTI-POINT LOCKING MECHANISM

CROSS-REFERENCE TO RELATED APPLICATION

This application claims the benefit under 35 U.S.C. § 119(e) of the earlier filing dates of U.S. Provisional Patent Application No. 62/518,832 filed on Jun. 13, 2017, and U.S. Provisional Patent Application No. 62/560,716 filed on Sep. 20, 2017, the disclosures of which are incorporated by reference herein; and this application is also a continuation-in-part of U.S. patent application Ser. No. 15/928,219 filed Mar. 22, 2018, which is a continuation of U.S. patent application Ser. No. 15/429,404 filed Feb. 10, 2017, and now U.S. Pat. No. 9,955,763, which claims the benefit under 35 U.S.C. § 119(e) of the earlier filing date of U.S. Provisional Patent Application No. 62/295,564 filed on Feb. 16, 2016, the disclosures of which are incorporated by reference herein.

BACKGROUND

This application discloses an invention which is related, generally and in various embodiments, to a conveniently enabled securement system including a portable encasement that is capable of providing secure storage and that is capable of strongly securely interacting with a common docking unit.

There is a need for a conveniently enabled portable securement system. In particular there is a need for a portable secure encasement for transporting goods from place to place while ensuring their security throughout, while having a simple and efficient means for securing the contents within the encasement and for securing the encasement itself at each location travelled to. There is a further need for an encasement with a multi-point locking system.

BRIEF DESCRIPTION OF THE DRAWINGS

Various embodiments of the invention are described herein in by way of example in conjunction with the following figures, wherein like reference characters designate the same or similar elements.

FIG. 5 illustrates various embodiments of the system that allow for contactless authentication and system to use feedback in accordance with the present invention;

FIG. 6 illustrates various embodiments of a portable secure encasement having a top openable door in accordance with the present invention;

FIG. 7 illustrates various embodiments of a secure portable encasement having an opening system wherein the top door is securable to the body of the secure portable encasement via an internal securement mechanism FIG. 8a illustrates various embodiments of the conveniently enabled securement system unmated to the common docking unit in accordance with the present invention;

FIG. 8b illustrates a cross sectional view of various embodiments of the conveniently enabled securement system illustrating how the conveniently enabled securement system mates the secure portable encasement seat onto the common docking unit such that the inseparably interaction is engaged in accordance with the present invention;

FIG. 9a illustrates various embodiments of the conveniently enabled securement system mated to the common docking unit in accordance with the present invention;

FIG. 9b illustrates a cross sectional view of various embodiments of the conveniently enabled securement system illustrating how the conveniently enabled securement system mates the secure portable encasement seat onto the common docking unit such that the inseparably interaction is engaged in accordance with the present invention;

FIG. 10 illustrates various embodiments of a mechanism for enabling the engagement of inseparable interaction between the secure portable encasement and the common docking unit in accordance with the present invention;

FIG. 11 illustrates various embodiments of a mechanism for enabling the engagement of inseparable interaction of the secure portable encasement with the common docking unit in accordance with the present invention;

FIG. 12a illustrates a perspective view of various embodiments of the secure portable encasement having an integral retractable cable and retracting cable mating receptacle for securing the secure portable encasement while away from a common docking unit in accordance with the present invention;

FIG. 12b illustrates a cross sectional view of various embodiments of the secure portable encasement having an integral retractable cable and retracting cable mating receptacle for securing the secure portable encasement while away from a common docking unit in accordance with the present invention;

FIG. 15a illustrates a perspective view of various embodiments of a soft secure portable encasement in accordance with the present invention;

FIG. 15b illustrates a front view of various embodiments of a soft secure portable encasement in accordance with the present invention;

FIG. 16a illustrates a perspective view of various embodiments of a soft secure portable encasement having a mechanism for securing the contents of the soft secure portable encasement within the encasement and an internally accessible simple cable docking mechanism for engaging and disengaging the inseparable interaction between the soft secure portable encasement and a common docking unit in accordance with the present invention;

FIG. 16b illustrates a perspective view of various embodiments of a soft secure portable encasement having a mechanism for securing the contents of the soft secure portable encasement within the encasement;

FIG. 17a illustrates a cut away perspective view illustrating various embodiments of a soft secure portable encasement showing an embodiment of the mechanism enabling the engagement and disengagement of the inseparable interaction with a common docking unit in accordance with the present invention;

FIG. 17b illustrates a cut away top view illustrating various embodiments of a soft secure portable encasement showing an embodiment of the mechanism enabling the engagement and disengagement of the inseparable interaction with a common docking unit in accordance with the present invention;

FIG. 17c illustrates a more detailed view of an embodiment of the mechanism enabling the engagement and disengagement of the inseparable interaction with a common docking unit in accordance with the present invention shown in FIG. 17a;

FIG. 17d illustrates a partial cross-sectional view of an embodiment of the mechanism enabling the engagement and disengagement of the inseparable interaction with a common docking unit in accordance with the present invention;

FIG. 20b is a front view of the combination lock sub-assembly of FIG. 20a;

FIG. 20c is a side view of the combination lock sub-assembly of FIG. 20a; and

FIG. 24 shows a front view of the multi-point locking system in an open position.

FIG. 25A shows an isometric front view of the multi-point locking system and encasement in an open and separated position.

FIG. 25B shows a back view of the multi-point locking system and encasement in an open and separated position.

FIG. 25C shows an isometric front view of the multi-point locking system and encasement in a locked position.

FIG. 29A shows a front view of an encasement with a multi-point locking system in an open position according to an alternative embodiment of the invention.

FIG. 29B shows a top perspective view of the multi-point locking system in an open position according to the alternative embodiment.

FIG. 29C shows a front view of the static tabs of the multi-point locking system according to the alternative embodiment.

FIG. 37 shows a right view of the multi-point locking system according to the alternative embodiment.

FIG. 38 shows a left view of the multi-point locking system according to the alternative embodiment.

FIG. 39A shows a close up, cut-away view of an alternate embodiment of the override system of the multi-point locking system in a locked position.

FIG. 39B shows a close up, cut-away view of an alternate embodiment of the override system of the multi-point locking system in an unlocked position.

DETAILED DESCRIPTION

Figure 1A:
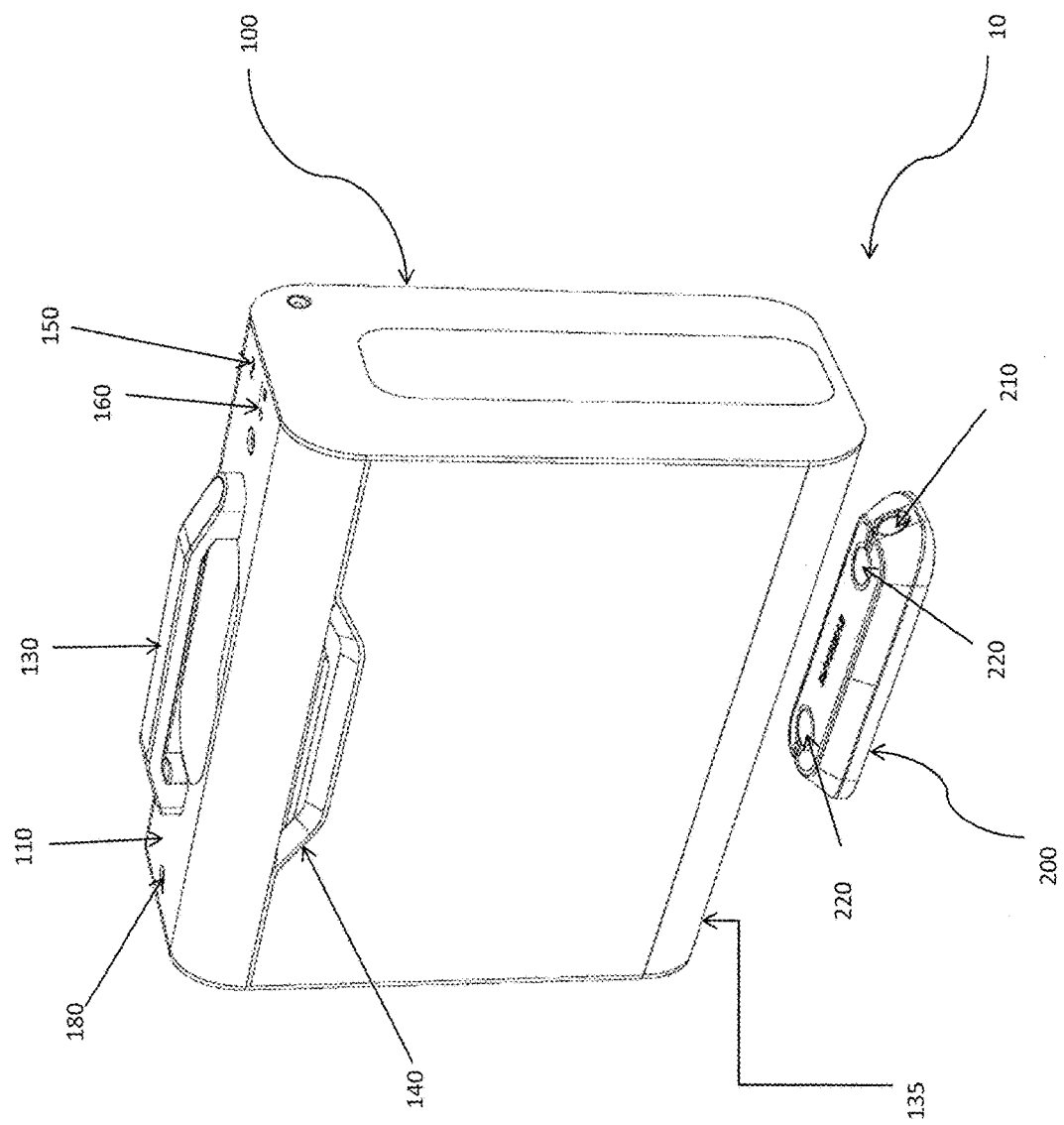
FIG. 1a illustrates various embodiments of a conveniently enabled securement system including a portable secure encasement that is capable of providing secure storage and that is capable of inseparably interacting with a common docking unit in accordance with the present invention.

It is to be understood that at least some of the figures and descriptions of the invention have been simplified to illustrate elements that are relevant for a clear understanding of the invention, while eliminating, for purposes of clarity, other elements that those of ordinary skill in the art will appreciate may also comprise a portion of the invention.

However, because such elements are well known in the art, and because they do not facilitate a better understanding of the invention, a description of such elements is not provided herein.

Referring now to the drawings, wherein like reference numbers are used herein to designate like elements throughout, the various views and embodiments of a conveniently enabled securement system including portable secure encasements and common docking units are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Figure 1B:
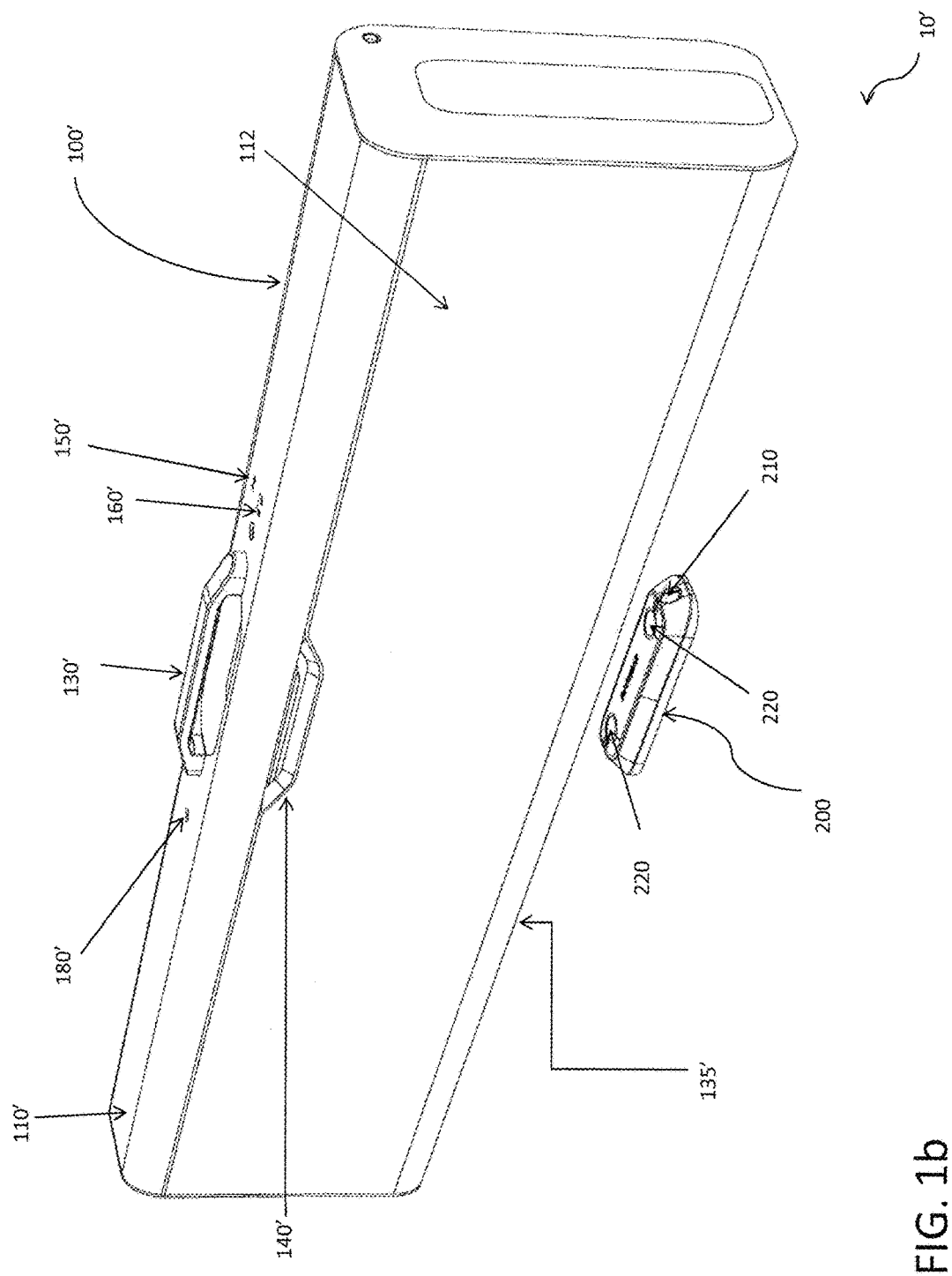
FIG. 1b illustrates various embodiments of a conveniently enabled securement system including a portable secure encasement that is capable of providing secure storage and that is capable of inseparably interacting with a common docking unit in accordance with the present invention.

FIGS. 1a and 1b are perspective views of various embodiments of a conveniently enabled securement system 10 and 10' including a hard portable secure encasement 100 and a hard portable secure encasement 100' adapted for storing long items which may be for example a rifle or other firearm. The hard portable secure encasements 100 and 100' according to various embodiments may be a safe, a strongbox, a safe-deposit box, a coffer, a money box, a cashbox, a cash register drawer, a gun ease or any similar type of container into which one may put valuable goods, objects or documents. The hard portable secure encasements 100 and 100' according to various embodiments are capable of providing secure storage, and capable of inseparably interacting with a common docking unit 200 when the hard portable secure encasements 100 or 100' are received by the common docking unit 200 and a user engages the system's 10 and 10' conveniently enabled securement functionality. As will be appreciated by the following description encasement 100 is capable of operating in system 10', and encasement 100' is similarly capable of operating in system 10, by virtue of the common docking unit.

The hard portable secure encasements 100 and 100' and common docking unit 200 of the various embodiments depicted in FIGS. 1a and 1b are configured with dimensional tolerances sufficient to allow a common docking unit 200 to flushly receive the hard portable secure encasements 100 and 100' such that the common docking unit 200 is entirely subsumed within the underside of the casing 135 or 135' of the hard portable secure encasements 100 and 100' without any play or excess space between the common docking unit 200 and the underside of the casing 135 or 135' of the hard portable secure encasement 100 or 100'.

To facilitate the receiving of the hard portable secure encasement 100 or 100' onto a common docking unit 200 the underside of the casing 135, 135' of the hard portable secure encasements 100, 100' in the embodiments depicted are formed with a recessed portion of substantially the same dimensions of the common docking unit 200; and, to enable the inseparable interaction between the hard portable secure encasement 100 or 100' and a common docking unit 200 each hard portable secure encasements 100 and 100' includes, in the embodiments depicted, a male securement mechanism 105 (for example see FIGS. 10 and 11) arranged on the periphery of the recessed portion of a hard portable secure encasement for interacting with the female securement mechanism 210 of the common docking unit 200.

In practice, the common docking unit 200 is strongly and securely mounted to a fixed object (for example see FIGS. 10 and 11) using the strongly secure mounting mechanisms 220. It will be appreciated that the strongly secure mounting mechanism 220 may for example be a bolt, or alternatively may be a weld, or an epoxy, or any other suitable means of strongly securing the common docking unit 200 to a fixed, and preferably immovable, surface, or in another preferred embodiment a mobile fixed surface such as in an automobile. A hard portable secure encasement 100, 100' may be dimensionally configured such that when it is received by the common docking unit 200, which is strongly mounted to a fixed mounting structure, the casing of the hard portable secure encasement 100 may be substantially, and preferably completely, flush with the mounting structure, thereby preventing access to the common docking unit 200, the male mechanism 105 (for example see FIGS. 10 and 11) and female mechanisms 210, which mechanisms 105, 210 when engaged cause the hard portable secure encasement 100 and the common docking unit 200 to inseparably interact with each other until disengaged.

Various additional features are depicted that further enable the convenient operation of the conveniently enabled securement system 10. According to various embodiments, the system 10 may include for example an opening system comprising a top door 110, 110'. The top door 110, 110' may be secured with an internal securement mechanism 125 (an example of which is illustrated at FIG. 7), which may be, for example, in various embodiments retractable steel bolts which are received by the internal strong structure of the hard secure portable encasement 100 or 100'. It will be appreciated that the internal securement mechanism 125 can be of any suitable type, for example in various embodiments the internal securement mechanism 125 may be two steel bolts having a diameter of 15 mm, but it will be appreciated that such bolts serving as the internal securement mechanism may be of any suitable size so long as they are capable of providing a desired level of security. The system 10 may alternatively include a two-stage opening system including a side door 112, 112' in addition to top door 110, 110'. When closed, top door 110, 110' secures side door 112, 112'. Additionally, the system 10 may include a carrying handle 130 or 130' for ease of transport; a remote receiver (not shown) which may be identified by an icon 150 or 150' on the surface of the hard portable secure encasement 100 or 100'; and, a machine-to-human feedback mechanism 160 or 160', which for example, may be an array of LEDS configured to illuminate in certain configurations in order to convey information to a human user. One will appreciate that any suitable feedback mechanism will suffice, for example the feedback mechanism could be a digital display, and LCD display or an audible sound. In another embodiment, the feedback mechanism is a vibration in the body of the case that can be felt by the user.

Figure 2:
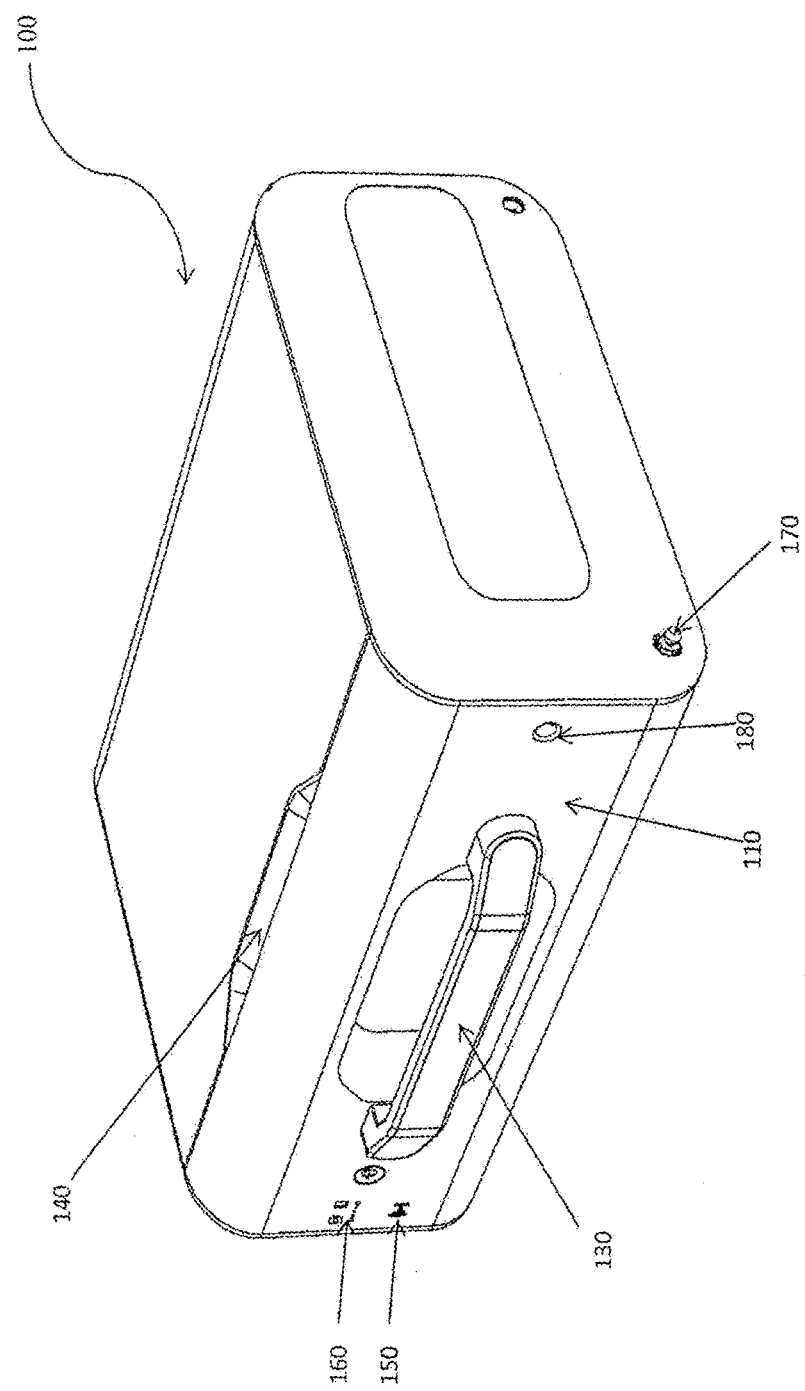
FIG. 2 illustrates various embodiments of portable secure encasement in accordance with the present invention.

FIG. 2 is a perspective view of various embodiments of a hard portable secure encasement 100 that is capable of providing secure storage. The casing body of the hard portable secure encasement 100 (and similarly 100' illustrated in FIG. 1b), including top door 110 (or 110'), is formed from any suitable material that prevents a determined attacker from readily gaining access to the contents (not shown) of the hard portable secure encasement 100 (or 100'). For example, the casing body is formed from a suitable material such as, but not limited to, structural plastic, reinforced thermoplastic acrylic, glass filled nylon, fiberglass, acrylonitrile-butadiene-styrene (ABS), structural foam, carbon fiber, other polymer materials, other woven fibrous material, other woven fibrous polymers, aluminum, steel, other suitable metals, etc., or any combination of such suitable materials. It will also be appreciated that the hard portable secure encasement can be formed into any suitable shape, symmetrical or asymmetrical, and for example may be adapted for the storage of long firearms as depicted in FIG. 1*b*. As will be appreciated the casing body may also be adapted to house small arm firearms, such as a pistol.

In various embodiments, for example, the hard portable secure encasement, for example 100, is constructed in a box shape having substantially rectangular sides and dimensions of 350 mm tall by 430 mm long by 170 mm deep. It will be further appreciated that the dimensions of the components of the system (for example a hard portable secure encasement 100, a soft portable secure encasement 600 and the common docking unit 200) are not restricted by anything other than the practicality of use of the intended system by a user and the contents intended for securement within a respective encasement, for example 100 or 100'. It will also be appreciated that the edges where the various sides meet may be square or beveled, and that any hinging mechanisms allowing top door 110 or 110' to hingeably open are entirely contained within the hard portable secure encasement 100 at 100' when the top door 110 or 110' is closed and secured, thereby preventing any tampering with such hinges by a would be intruder or thief. The various embodiments depicted in FIG. 2 additionally include an integral retractable cable 170 or 170' and retracting cable mating receptacle 180 or 180'. The combination of the integral retractable cable 170 (or 170') and the retractable cable mating receptacle 180 (or 180') allow a user to strongly secure the hard portable secure encasement 100 (or 100') or alternatively soft portable secure encasement 600, such as a backpack, (an example of which is illustrated at FIGS. 15*a*, 15*b*) when a common docking unit is not readily available.

Figure 3:
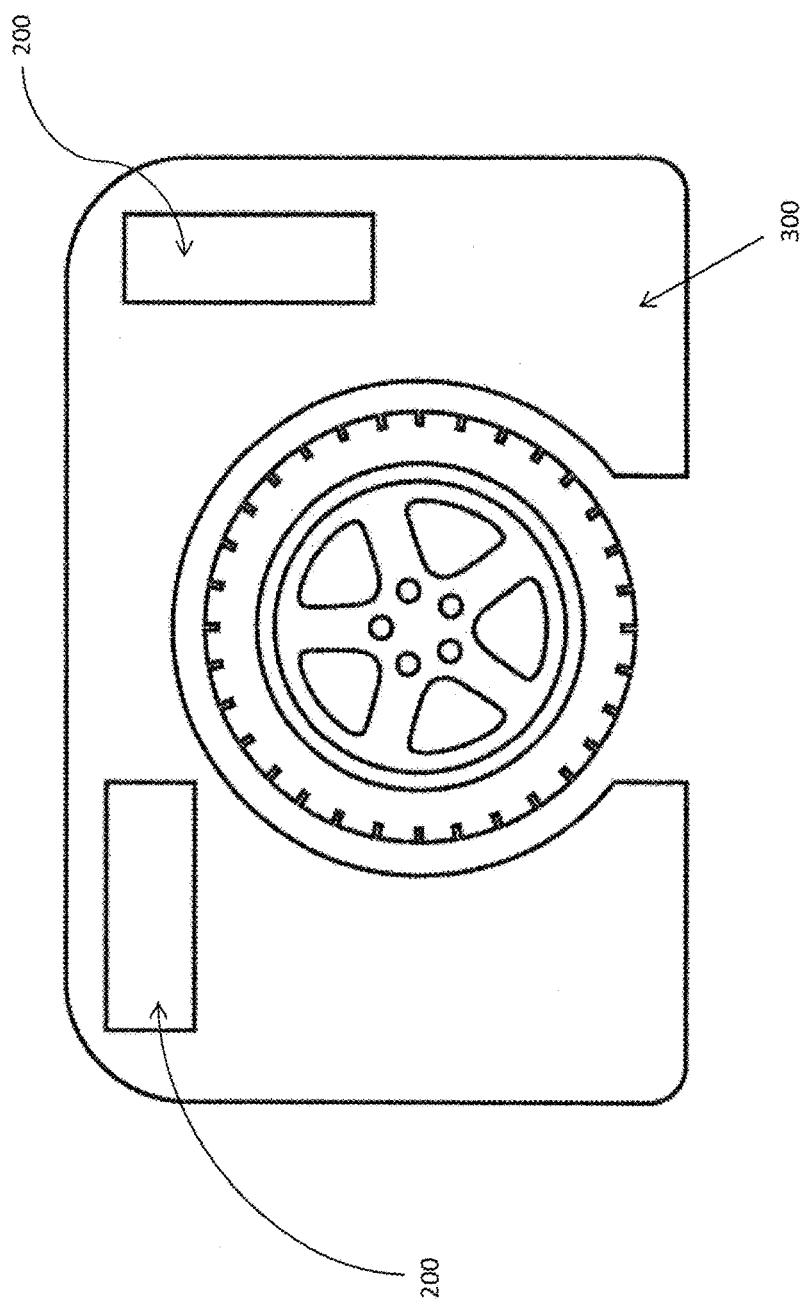
FIG. 3 illustrates various embodiments of a mounting scheme within the trunk or boot of an automobile for securely mounting the common docking unit in accordance with the present invention.

FIG. 3 depicts a schematic view 300 of various orientations in which a common docking unit 200 may be strongly securely mounted within the trunk or boot of an automobile. It will be appreciated that the common docking unit 200 may in various embodiments be strongly securely mounted to any suitable fixed, or mobile, structure. Preferably when secured to a mobile structure the mobile structure is otherwise securable, for example an automobile trunk. Preferably when secured to a fixed structure, such a structure itself is immovable. Other examples (not shown) of mounting structures are concrete slabs which are configured to accept mounting screws (not shown), the bed of a truck, the floor of a house, a fixed steel beam, or any structure suitable for securely mounting structures thereto, by for example a bolt, or a weld, or any suitable means.

Figure 4:
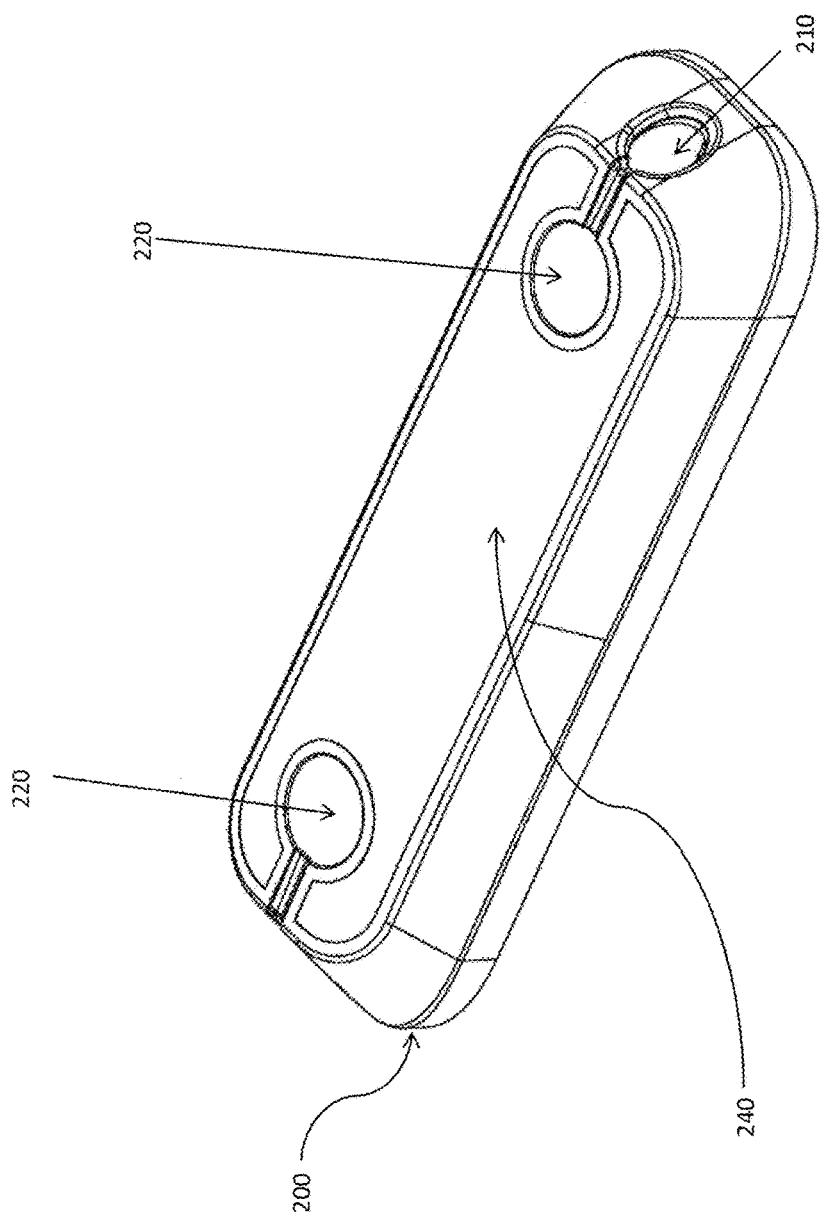
FIG. 4 illustrates various embodiments of a common docking unit in accordance with the present invention.

FIG. 4 depicts a common docking unit 200 that is capable of receiving a hard portable secure encasement 100, 101' (FIG. 1*a*, 1*b*) or a sort portable secure encasement 600 (an example of which is illustrated at FIG. 15*a*) such that the respective encasement and the common docking unit 200 are capable of inseparably interacting. The common docking unit 200 of the various embodiments depicted includes a common docking unit body 240 having a female securement mechanism 210, preferably two female securement mechanisms 210 arranged opposite of or distally from each other, and is preferably strongly securely mounted using to a fixed object or mobile object (not shown) using the strongly secure mounting mechanisms 220. Here, the strongly secure mounting mechanisms 220 are shown as through-holes capable of receiving a bolt or screw, but it will be appreciated that any strongly secure mounting mechanism or means will suffice (for example a metal to metal weld, or a strong epoxy, or a glue, or a clamp). It will be appreciated that the common docking unit body 240 may be singularly formed as a molded object of any suitable material, or it may be comprised of a body housing (not shown) containing various internal workings (not shown) of the common docking unit. For example, in various embodiments the body may be formed of a body housing in which resides a steel plate, in which case the body is formed to assist proper reception of a portable secure encasement while the steel plate provides the strong securement mountable functionality. In other embodiments, the common docking unit may be shaped metal, die cast, or an extruded metal body, and subjected to various cutting, drilling, taping machining operations. It will be appreciated that the common docking unit may be formed or assembled from any suitable materials and in any configuration that allows for strongly secure mounting and inseparable interaction with a portable secure encasement, for example 100.

Additionally, it will be appreciated that the common docking unit may be configured with either a male securement mechanism, a female securement mechanism 210 as depicted or any other suitable securement mechanism, and that the remote securement mechanism actuation mechanism may reside in either the portable secure encasement 100, 100', 600, or in the common docking unit 200 (in which case the system 10, 10' may be configured such that the respective secure encasements instead have a passive securement mechanism). It will be further appreciated that the common docking unit 200 may have any suitable dimensional configuration, so long as the receiving portion of the attendant secure encasements is suitably shaped. In one embodiment for example the common docking unit has a length of 250 mm a height of 27 mm and a width of 75 mm, while in another embodiment the common docking unit may be cylindrical in shape with a radius of approximately 200 mm and a height of 30 mm. In any case, it will be appreciated that the size and shape of the common docking unit is necessarily derived in relation to the design, shape and size of a corresponding secure portable encasement while also taking into consideration the intended contents of such a secure portable encasement and the level of security deemed necessary. It will be further appreciated that the dimensions of the components of the system (for example a hard portable secure encasement 100, a soft portable secure encasement 600 and the common docking unit 200) are not restricted by anything other than the practicality of use of the intended system by a user and the contents intended for securement within a respective encasement.

FIG. 5 illustrates various embodiments of a remote interaction device 190 for interacting with a hard portable secure encasement 100. In the embodiments depicted in FIG. 5 a user using RFID based embodiment of remote interaction device 190 may, for example, interact with the hard portable secure encasement 100 (or 100') in order to engage the docking securement mechanism of the hard portable secure encasement 100 such that the hard portable secure encasement 100 inseparably interacts with a common docking unit 200. Alternatively, for example, a user may use the remote interaction device 190 in order to disengage the internal securement mechanism 125 of the portable secure encasement thereby allowing it user to open the top door 110 (or 110'). For example, the user may hold the RFID chip within a certain proximity of a logo or other indicia 150, 150' which identities the location of a remote receiver (not shown) within the hard portable secure encasement 100, 101' for less than one second to disengage the internal securement mechanism 125 (illustrated in FIG. 7) and for two or more seconds to disengage the male securement mechanism 105 from the female securement mechanism 210 of the common docking unit 200.

It will be appreciated that various embodiments of the present application may make use of either of a remote interaction device 190 such as that depicted in FIG. 5, or a manual interaction mechanism, or any combination thereof. It will be further appreciated that any interaction mechanism or device internal or external to a secure encasement that is suitable for efficiently and conveniently enabling the securement mechanism, or otherwise providing human-to-machine interaction may be employed in embodiments of the invention without exceeding the scope of the inventions disclosed herein, for example a biometric sensor, keypad, swipe pad, optical transmitter, facial recognition mechanism, voice recognition mechanism, an app or other computer application capable of remotely communicating with a portable secure encasement (for example over Wifi, Bluetooth, or cellular network), or any combination thereof can be employed while remaining within the scope of the present invention. In other embodiments, remote interaction device 190 may itself have a machine-to-human feedback mechanism such that device 190 can provide a user feedback or information about for example the encasement 100 and its status, or other relevant information regarding the convenient securement system 10.

FIG. 5 also illustrates various embodiments having a machine-to-human feedback mechanism 160. It will be appreciated that this machine-to-human feedback mechanism 160 or 160' can be of any suitable design, for example, as depicted in FIG. 5 the machine-to-human feedback mechanism is a series of LEDs which are configured to light in particular combinations, with each combination being a specific message tailored in provide the user with information relevant to the current user interaction with the convenient securement system 10, for example, one light may indicate that the male securement mechanism 105 is engaged with the female securement mechanism 210 of a common docking unit 200 yet the internal securement mechanism 125 is not engaged while five lights may mean that all securement mechanisms are engaged indicating the system is providing maximum security of the contents contained within a hard portable secure encasement 100. The use of an icon 150 and LEDs 160 for indicating information to a user simplifies the interaction while overcoming language barriers. It will also be appreciated that any suitable icons may be used to convey relevant information to a user, and that any machine-to-human feedback mechanism internal or external to the secure encasement may be employed in concert with a portable secure encasement 100, 100', 600 in order to convey information about the system 10 to a user.

Figures 14A, 14B:
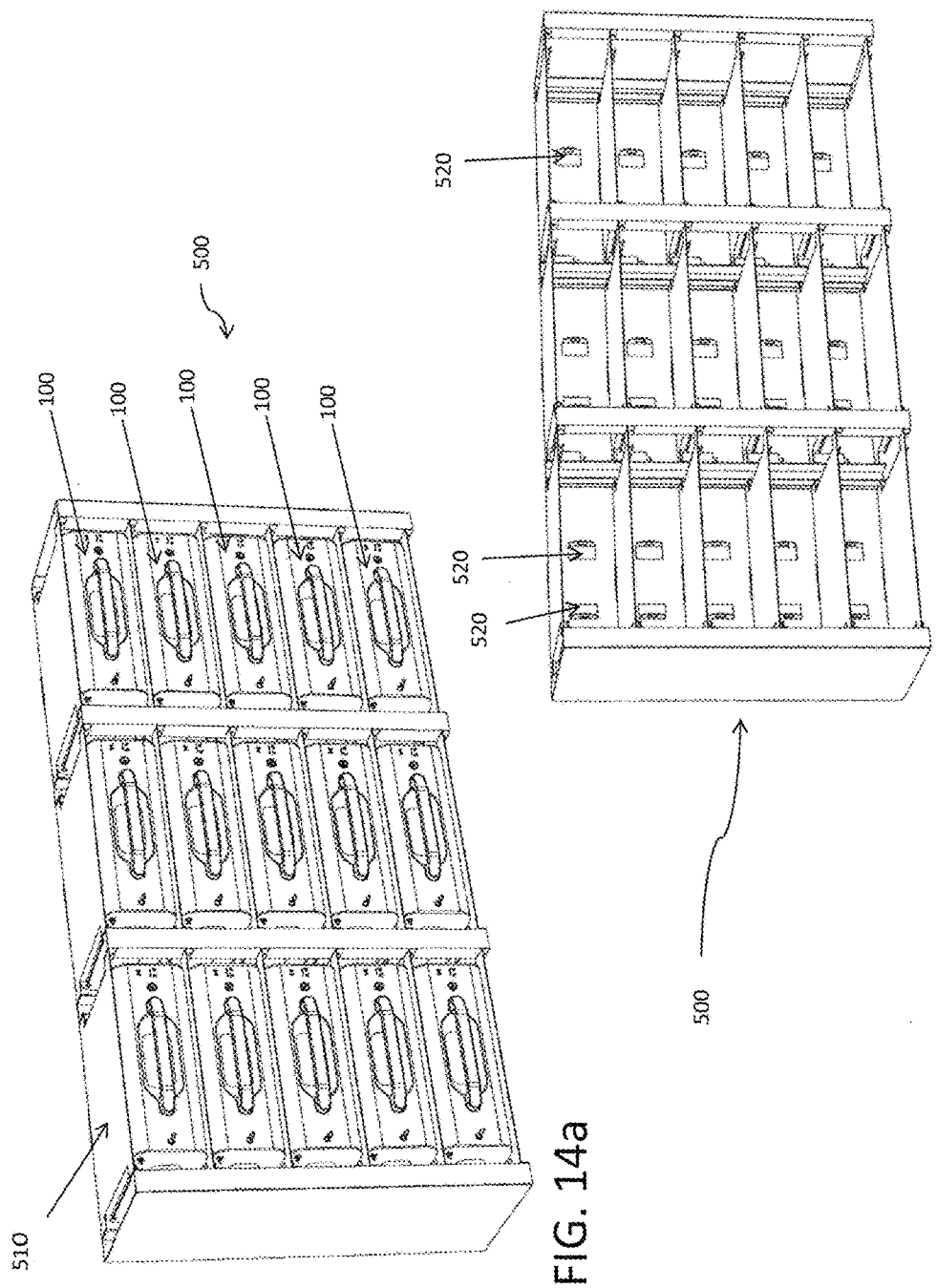
FIG. 14a illustrates a perspective view of various embodiments of a rack mountable common docking unit showing a plurality of secure portable encasements rack mounted to the rack mountable common docking units in accordance with the present invention.
FIG. 14b illustrates a perspective view of various embodiments of a rack mountable common docking unit showing barren rack mountable common docking units in accordance with the present invention.

It will be further appreciated that in various embodiments the common docking unit 200 may be configured with the circuitry (not shown) and mechanisms (not shown) necessary to enable human-to-machine and machine to human interaction. For example, while hereinabove the common docking unit 200 has been described as operating in a passive manner, it is within the scope and intention of this invention that the common docking unit may have active components for engaging securement mechanisms and thereby causing the common docking unit 200 and, for example, the hard portable secure encasement 100 to engage in inseparable interaction until the common docking unit 200 disengages the securement mechanisms. In these cases, a user may wish to remotely interact with the common docking unit 200, for example in a situation where a user has a bank of common docking units 200 for storing a bank of portable secure encasements (for example as depicted in FIG. 14a) and has a need to be able to remotely disengage individual portable secure encasements on an as needed basis.

FIGS. 6 and 7 illustrate the operation of an embodiment of the opening system. FIG. 6 shows the closed top door 110. A user opens the top door 110 by first disengaging the internal securement mechanism 125 using, for example, an RFID type remote interaction device 190, and then by lifting an opening latch 140, or the carrying handle 130, the lop door 110 hingeably opens. It will be appreciated that the opening system may be designed, configured and operated in any suitable manner that does not interfere with either the strongly securing of casing of the hard portable secure encasement 100, 100' or the inseparable interaction of the hard portable secure encasement 100, 100' with a common docking unit 200. FIG. 7 illustrates various embodiments of the hard portable secure encasement unsecured and opened with internal securement mechanism 125 and pins 126 visible.

FIGS. 8a, 8b, 9a, 9b and 10, and 11 illustrate how various embodiments of the hard portable secure encasement 100 and 100' are received by the common docking unit 200. The embodiments depicted in FIG. 8a illustrate that a hard portable secure encasement 100 is placed over and on a common docking unit 200 which is configured to receive the encasement 100. The common docking unit 200 is strongly securely mounted to a fixed mounting surface 260 by bolts 250 (shown in FIG. 8b) received by the strong mounting mechanism 220 and embedded into fixed mounting surface 260. FIG. 8b illustrate a cutaway view of a hard portable secure encasement 100 that is received by a common docking unit 200 such that the encasement 100 and common docking unit 200 are engaging in inseparable interaction, with male securement mechanism 105 engaged with female securement mechanism 210. FIG. 9a shows encasement 101' received by a common docking unit (not visible) such that the underside 135' of encasement 101' is substantially flush fixed mounting surface 260. FIG. 9b illustrate a cutaway view of a hard portable secure encasement 100' that is received by a common docking unit 200 such that the encasement 100' and common docking unit 200 are engaging in inseparable interaction, with male securement mechanism 105' engaged with female securement mechanism 210. FIG. 9b also illustrates bolts 250 passing through strong mounting mechanism 220 to secure the common docking unit to the fixed mounting surface 260.

FIGS. 10 and 11 illustrate cut away cross sectional views of both the hard portable secure encasement 100 and the common docking unit 200 showing embodiments of the securement mechanisms 105 and 210 and illustrating how they engage to inseparably interact.

FIG. 10 illustrates various embodiments of the male securement mechanism 105 and the female securement mechanism 210. As illustrated the male securement mechanism 105 is a sprung pin having a beveled end which when the hard portable secure encasement 100 is properly placed over the common docking unit 200 aligns such that the beveled end 106 of the sprung pin interacts with a lip of the female securement mechanism 210 forcing the sprung pin of the male mechanism 105 first away from the female securement mechanism 210 against the tensions of one or more springs such that once the male mechanism 105 passes beneath the lip of the female securement mechanism 210 the spring 107 force pushes the end of male securement mechanism 105 into the female securement mechanism 210. While in an unsecured slate only the beveled end of the male securement mechanism 105 resides within the female securement mechanism 210, allowing a user to easily remove the hard portable secure encasement 100 from the common docking unit by lifting the hard portable secure encasement 100 causing the beveled end of the male securement mechanism to interact with the lip of the female securement mechanism again forcing the sprung pin to retract away from the lip and therefore pass out of the female securement mechanism.

In various embodiments, the female securement mechanism is merely a passive receptacle as illustrated in FIG. 10, however it would be appreciated that the female securement mechanism 210 can alternatively be any suitable securement mechanism configured to allow inseparable interaction with a mating securement mechanism of a portable securement encasement. Similarly, it will be appreciated that while in the various embodiments illustrated in FIG. 10 the male securement mechanism 105 is depicted as a steel sprung bolt, it would be appreciated that the male securement mechanism 105 can be any suitable securement mechanism configured to allow inseparable interaction with a mating securement mechanism of a common docking unit.

FIG. 11 depicts various embodiments of the male and female securement mechanisms 105 and 210 in a secured state such that the securement mechanisms 105 and 210 are inseparably interacting. In the embodiments illustrated, to place the system 10 into a secured state a motor 108 driven locking pin 115 engages the male securement mechanism 105 by forcing it to the maximum extent possible into the female securement mechanism thereby preventing removal of the hard portable securement encasement 100 from the common docking unit 200. It will be appreciated that because the docking unit is preferably shaped to be flush with the body of the encasement 100, there is no play or movement or shifting of the encasement in relation to the common docking unit, such that when the securement mechanisms 105, 210 are engaged, the encasement 100 and the common docking unit are inseparable until the securement mechanisms 105, 210 are disengaged. Also depicted in FIGS. 10 and 11, is the strongly securely mounting of the common docking unit 200 to a mounting surface 260 using strongly secure mounting mechanisms 220, through which bolts 250 are passed and embedded in the fixed mounting surface 260.

The various embodiments depicted in FIGS. 10 and 11 illustrate the strongly secure mounting mechanisms 220 are receptacles comprising a narrow base receptacle below a wider up receptacle each of which are configured to receiving a mounting bolt 250, having a diameter of the upper receptacle portion of mechanism 220, through the mechanism 220, which bolt 250 inseparably interacts with the mounting surface 260 by being threaded into the mounting surface 260. The bolt having a wider head portion cannot pass through the narrow base receptacle and thereby allows for the application of a force to the narrow base receptacle as the mounting bolt 250 is threaded further into the mounting surface 260. It will be appreciated, however, that the strongly secure mounting mechanisms 220 may be any suitable strongly secure mounting mechanism that will effectively and inseparably bind the common docking to the mounting surface without interfering with the inseparable interaction between the hard portable secure encasement 100 and the common docking unit 200. FIG. 11 furthermore illustrates that when properly seated and received onto the common docking unit 200, the hard portable securement encasement 100 sits flush, or substantially flush, with the mounting surface 260.

It will be appreciated that any of the male securement mechanism 105, the female securement receptacle 210, the sprung bolt 105, the driving pin 115 and the secure mounting mechanisms 220 may be formed or constructed of any suitable material capable of providing the secure interactions between the various identified mechanisms.

FIG. 12a is a perspective view of various embodiments, with particular emphasis on various embodiments of an integral retractable cable 170 and corresponding retractable cable mating receptacle 180. FIG. 12b illustrates a cutaway view of encasement 100. In the embodiments described in FIG. 12a, when a user is in a location where a common docking unit, for example 200, is not available the user may secure the hard portable secure encasement using the retractable cable 170. To do so, the user would extend the retractable cable 170 from the body of the secure portable encasement 100 wrap it around a fixed object (not shown), and insert the cable securement mechanism 175 into the retractable cable mating receptacle 180. Once inserted the cable securement mechanism 175 engages with the cable mating receptacle 180 such that the two inseparably interact. Once engaged, the cable is effectively inseparably bound to the hard portable secure encasement at each end and around the fixed object and thus is secured to the fixed object.

The engagement of the cable securement mechanism 175 and the retractable cable mating receptacle 180 may occur automatically, or may require some human-to-machine interaction between a user and the portable secure encasement, for example by using remote interaction device 190. To disengage the cable securement mechanism 175 from the retractable cable mating receptacle 180, the user may disengage. For example with device 190, the inseparable interaction between the two, 175 and 180, thus releasing the retractable cable 170 allowing it to retract within the body of the hard secure portable encasement 100, as illustrated in FIG. 12b, where it may be contained on a reel mechanism 171. It will be appreciated that the retractable cable 170, the cable securement mechanism 175, the cable retaining reel mechanism 171, and retractable cable mating receptacle 180 may be formed, assembled or constructed of any suitable materials. It will be further appreciated that while FIGS. 12a and 12b depicts the retractable cable 170 and retractable cable mating mechanism 180 within a hard portable secure encasement 100, they can also be employed within a soft portable secure encasement 600.

Figure 13:
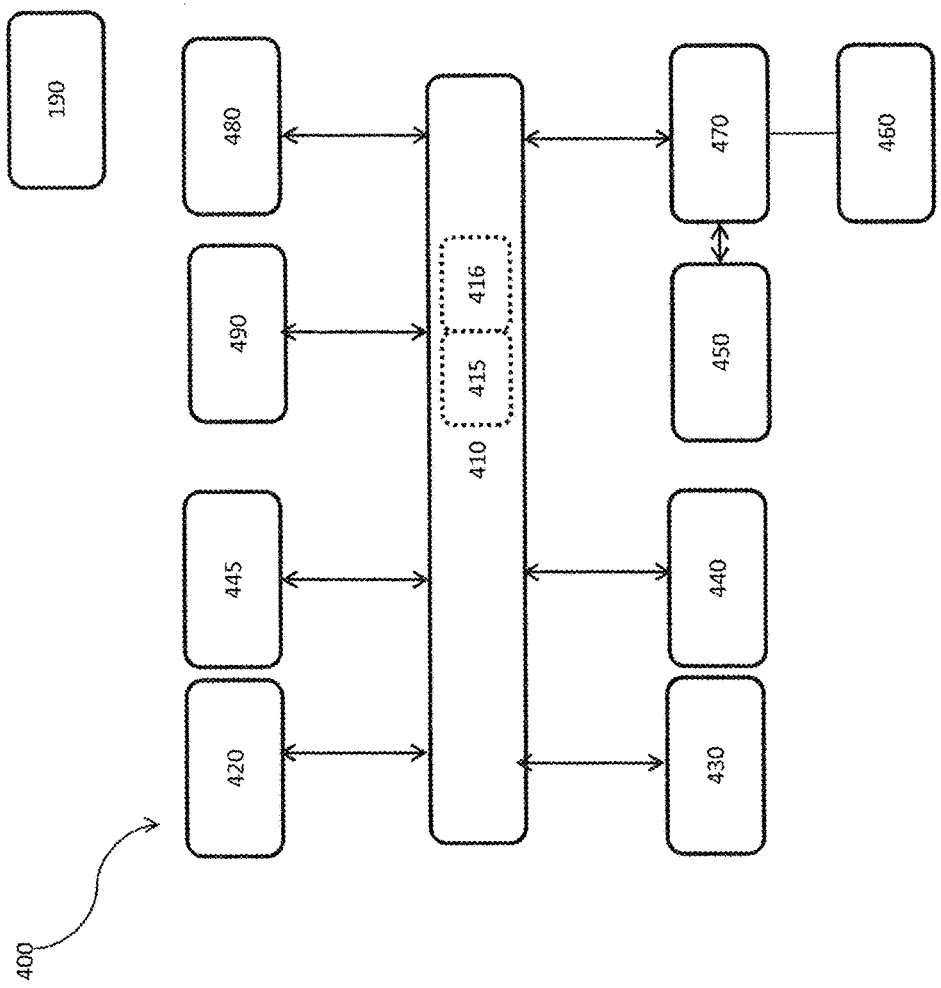
FIG. 13 illustrates a schematic view of various embodiments of the enabling electronics, control circuitry and related control/data information flow of the conveniently enabled securement system in accordance with the present invention.

FIG. 13 describes a schematic view of control components 400 for enabling the functionality of a conveniently enabled securement system, for example 10. In the various embodiments described by FIG. 13 the illustrated control components shown are housed within a hard portable secure encasement, for example 200. Comprising the control components 400 are a microcontroller 410, external securement mechanism motor controllers 420 and internal securement mechanism motor controllers 430, external securement mechanism position sensors 440 and internal securement bolt sensors 445, a battery 450, a charging and battery management control circuit 470, a machine-to-human feedback control circuit 480, a human-to-machine interaction device receiver 490, such as an RFID receiver, a BLUETOOTH™ receiver, a WIFI receiver, an optical receiver, or any other suitable remote receiver capable with interacting with a corresponding remote interaction device 190. Also shown are an AC-DC power supply 460, which may be internal or external to the encasement, as well as a remote interaction device 190.

The motor control 430 provides the driving forces to engage or disengage the internal securement mechanisms, for example 125, which secure the top door 110, 110' to the casing of the hard portable secure encasement 100, and motor control 420 provides the driving forces for engaging or disengaging the external securement mechanism, for example the male securement mechanism 105, which inseparably interact with securement mechanisms of a common docking unit, for example 200. The bolt position sensor 440 monitors and communicates the position of an external securement mechanism, for example a male securement mechanism 105, while the bolt position sensor 445 monitors and communicates the position of an internal securement mechanism, for example 125.

The battery 450 provides power to the various components illustrated in the schematic view of control components 400, and may be one or more of any suitable battery having a long life, for example a Lithium ion button. The charging and battery management control circuit 470 may monitor and communicate the remaining charge of the battery 450 and when the portable secure encasement receives power from a source, for example an AC-DC power supply 460, circuit 470 may control the recharging of the battery 450. The machine-to-human feedback control circuit may receive information from various components directly or via the micro controller 410 and may convert that information to a human readable formal, for example lighting a series of LEDs in a particular sequence, or sending output to a display device.

The human-to-machine interaction device control circuit 490 receives input from an input device, for example a remote interaction device 190 or a manual input mechanism, and converts that input into a machine readable format and forwards that converted input to the microcontroller 410 which translates the converted input into a series of commands issued to the various components, for example upon receiving input from a remote interaction device 190 the human-to-machine interaction device control circuit converts the input into machine readable format and sends the converted input to microcontroller 410 which interprets the command as, for example, an instruction to engage the internal securement mechanism 125, and thereafter the microcontroller 410 issues a command to the motor control 430 which provides driving force to the internal securement mechanism 125 thereby engaging, for example, steel bolts from the top door into the casing of the portable secure encasement 100, subsequently the bolt position sensor 445 monitor the position of the engaging steel bolts of the internal securement mechanism 125 and when the engagement is complete the bolt position sensor 445 issues a communication in machine readable format to the microcontroller 410 to inform the microcontroller 410 that the internal securement mechanism has been engaged, thereafter, the microcontroller issues a command corresponding to the engagement of the internal securement mechanism 125 to the machine-to-human interaction control circuit 480 which receives the command and converts it to a human readable format by, for example lighting a particular sequence or series of LEDs.

Microcontroller 410 comprises a microcontroller and attendant memory 415 and processor 416 wherein the attendant memory 415 contains instructions which when executed by the attendant processor 416 cause the microcontroller to receive communications between the various components illustrated in the schematic view of control components 400, translate those communications into corresponding commands, and then issue those commands to the designated component. For example, when the charging and battery management control circuit 470 senses that the battery charge is low, it issues a communication to the microcontroller which interprets the communication into a series of commands, for example a command to the machine-to-human interaction mechanism 480 and a command to the motor controllers 420 and 430, subsequently the machine-to-human interaction mechanism 480 displays, for example a series of LEDs indicating that the battery has little charge and the motor controllers 420 and 430 interpret their respective command to, for example prohibit disengaging of the securement mechanisms.

It will be appreciated that the above examples are intended for illustrative purposes only and that in practice the communications issued and received by any component of the conveniently enabled securement system 10 may be any suitable communications. It will also be appreciated that in various embodiments of the system 10 there may be a desire for communications between a portable secure encasement, for example 100, and a common docking unit, for example 200, in which case the respective portable secure encasement and common docking unit will contain the necessary circuitry and mechanisms for providing a communications channel between the two and for relaying information between the two. Such a communication channel may be a wireless communication channel or a wired channel that is established when the securement mechanisms 105 and 210 are engaged.

FIGS. 14a and 14b illustrate various embodiments of a rack 500 of common docking units 520 for storing a set 510 of hard portable secure encasements 100. FIG. 14b also depicts an empty rack of common docking units capable of storing portable secure encasements 100. It will be appreciated that the rack 500 can be adapted for storing any portable secure encasement 100, 100' and 600 or otherwise so long as the encasement has a securement mechanism capable of securely interacting with the common docking units 520. As shown in FIG. 14b, the common docking units 520 shown here are formed of two separate formed metal plates, which may be secured to the rack 500 by for example a weld.

FIGS. 15a and 15b illustrates various embodiments of a soft portable secure encasement 600. Contents reside within the soft portable secure encasement 600 and are so secured within the encasement 600 by, for example a combination lock constituting a locking mechanism 660 (shown in FIGS. 16a, 16b, 16c, 16d, 16e and 16f) that secures a securable mouth opening 625 (shown in FIGS. 16a, 16b and 16c) which as depicted in FIGS. 15a and 15b are hidden beneath soft top cover 630. FIG. 15b illustrates the encasement 600 secured to a common docking unit (not visible) that is secured to a fixed surface 260, by bolts 250, which are visible by virtue of a cutaway view of the surface 260. The casing of the soft portable secure encasement may be formed from a cable webbing (not shown) running throughout the casing 650, which is covered by a soft, aesthetically pleasing, shell, for example giving it the appearance of a knapsack or hook bag. Alternatively, the casing 650 of the soft portable secure encasement 600 may be a cut proof fabric material, in which case the cable webbing is not required.

Any suitable cut proof fabric material may be used to form the casing 650, for example, Cut-Text® Pro, developed by PPSS Group of Whitfield Business Park, Knaresborough HG5 8BS, UK. In such a case the casing 650 formed of Cut-Text® Pro may be for example 1 mm thick, and is internally overlock stitched to protect the seams. In various embodiments, the cut proof fabric material may be sewn into a separate bag, which may be constructed like a standard backpack, but with no base. These two components, the cut proof material and the separate bag, are then sewn together to leave a tube of at least the cut proof fabric at the base. Into the tube of fabric, an inner plastic part is inserted inside the lube, and is clamped to an external strong plastic base 668, thereby wedging the fabric tube in between the walls of the two plastic parts. This prevents the necessity of a seam at the junction between the fabric and the base of the bag, which may be a point of intrusion. As shown in FIG. 17d, the fabric tube is attached to plastic base 668 by screws.

When the soft top cover is closed over the mouth opening 625 it is secured using connector straps 640. The soft portable secure encasement 600 may be carried via a carrying handle 610 or carrying straps 620. It will be appreciated that the soft top cover 630, carrying handle 610, and carrying straps 620 may or may not also have a cable webbing running throughout depending on the level of security desired, or alternatively will also be made of cut proof fabric, in such away the carrying straps may be protected from a would be thief attempting to cut the straps 620 while the encasement 600 is being carried during transport.

Figure 16C:
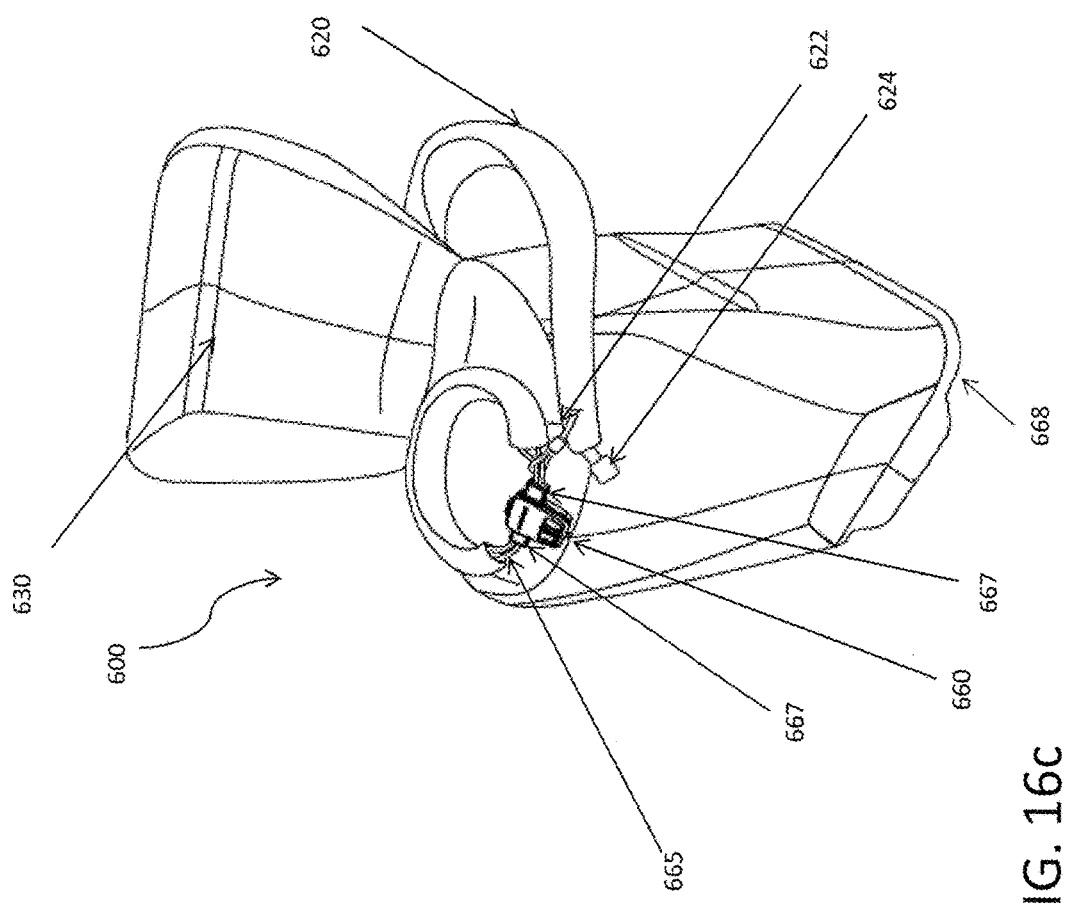
FIG. 16c illustrates a perspective view of various embodiments of a sort secure portable encasement having a mechanism for securing the contents of the soft secure portable encasement within the encasement.

FIGS. 16a, 16b and 16c illustrate various embodiments of a soft portable secure encasement 600 with soft top cover 630 removed and so showing the securable mouth opening 625 and corresponding locking mechanism 660, which may be, for example, a combination lock. FIG. 16a provides a perspective view of the soft portable secure encasement 600 with the locking mechanism 660 (FIGS. 16d, 16e and 16f) disengaged from the securement cable 665. Securement cable 665 may for example run through a seam in the mouth portion of the casing 650 such that two pins 667 are exposed which are capable of securely interacting with the locking mechanism 660. Securement cable 665 may be double parallel cables to prevent the roll top from being accessed. FIG. 16b illustrates various embodiments of encasement 600 with the pins 667 of the cable 665 engaged with the locking mechanism 660. In order to secure the mouth opening 625 of the encasement 600, the mouth opening portion of the easing 650 may be formed to have an excess length of cut proof fabric, or fabric lined with cable webbing, that extends away from the mouth in a tube like manner, which excess length would be closed and rolled over several times (as would be done with a standard roll top dry bag), and then the cable 665 would be cinched over the rolled excess fabric, and secured by the interaction of the pins 667 and the locking mechanism 660 thus preventing access to the internal compartment (not shown) of the soft portable secure encasement 600.

FIG. 16c provides another perspective view of various embodiments of the soft secure portable encasement 600, and further demonstrating how the soft secure portable encasement 600 is capable of being secured when a common docking unit 200 is not available. Carrying straps 620 may comprise, for example, a steel cable 622 running through the length of the strap. Steel cable 622 may be adapted to have a loop portion at one end, and strap 620 may be adapted with a connector 624 which allows one end of strap 620 to be disengaged from the body of the encasement 600. By disengaging connector 624, cable 622 of strap 620 may be used to secure the soft secure portable encasement 600 to a fixed object by passing pin 667 through the loop end of cable 622, and then securing pins 667 to the locking mechanism 660.

Figure 16E:
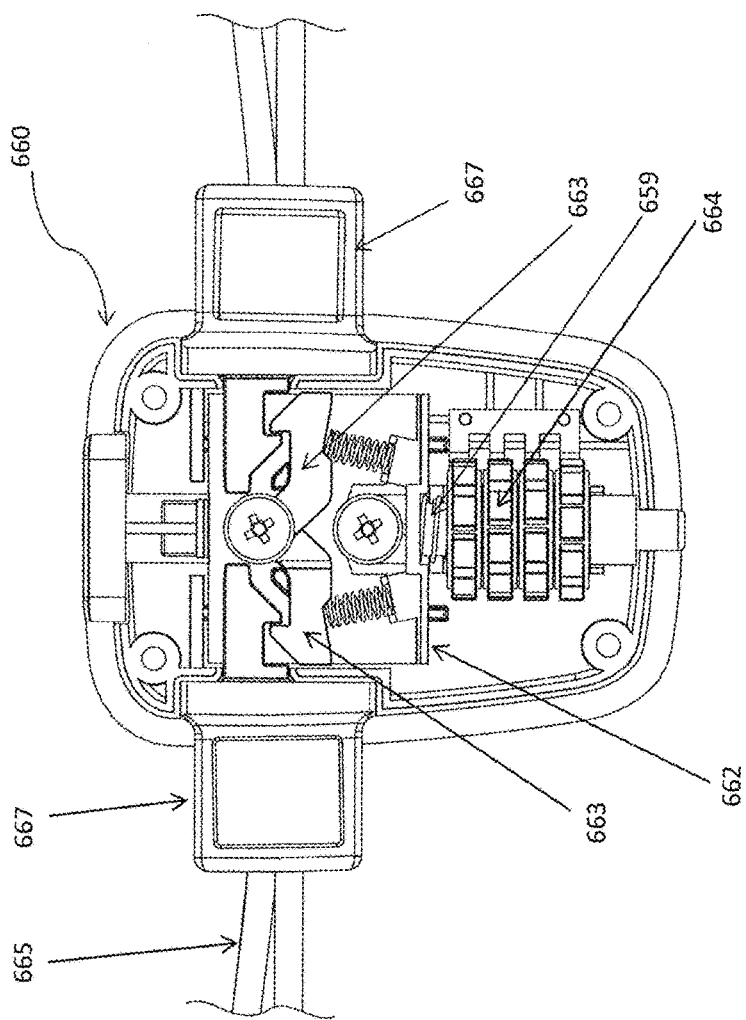
FIG. 16e illustrates a front view of various embodiments of the locking mechanism.
Figure 16D:
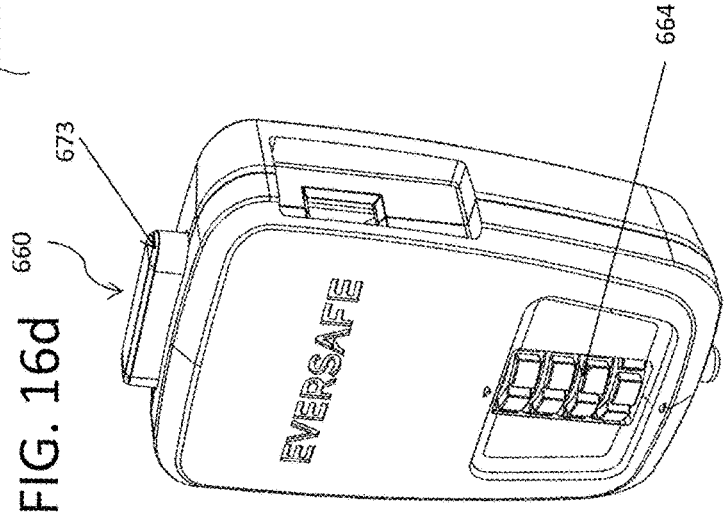
FIG. 16d illustrates a perspective view of various embodiments of a locking mechanism.
Figure 16F:
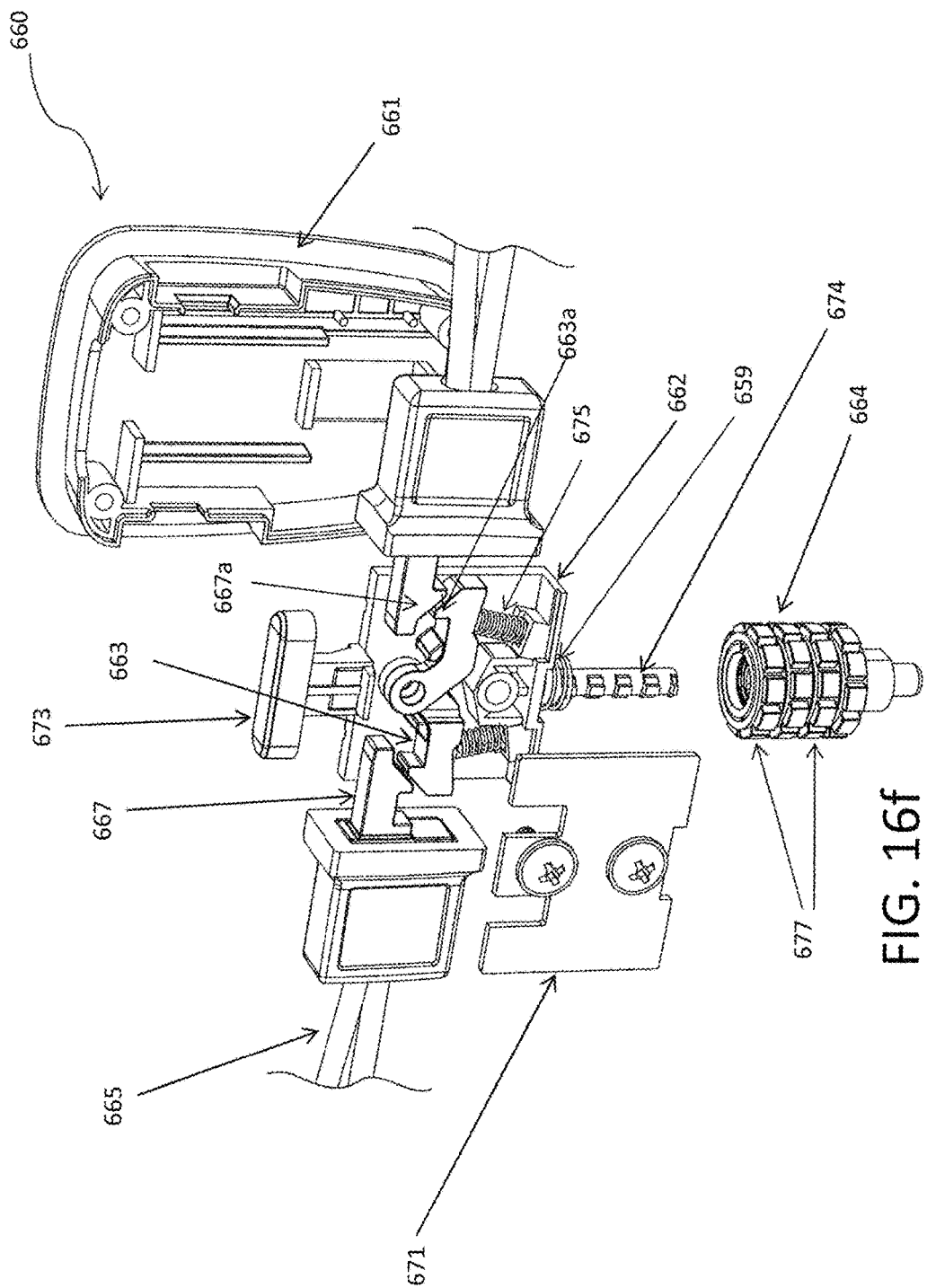
FIG. 16f illustrates an exploded view of various embodiments of a locking mechanism.

Referring to FIGS. 16d, 16e and 16f, locking mechanism 660 is preferably a double sided combination lock having an internal mechanism with two independent and separately movable latches 663 allowing two separate pins 667 (FIG. 16c) locked into one combination lock. Pins 667 are preferably rectangular in cross-section (FIG. 16a) so that the mouth opening portion of the casing 650 cannot be unrolled providing access to the contents. Both latches 663 and pins 667 include hook portions 663a and 667a, respectively, which cooperate with one another to form a secure releasable locking arrangement. Locking mechanism 660 includes a combination lock mechanism 664 having individually rotatable locking rollers 677 for which a user may enter in a unique unlock code by rotating the rollers 677 to an unlock position. Referring to FIG. 16f, which shows pins 667 partially disengaged from latches 663, locking mechanism 660 further includes a rear casing 661 and a front support plate 671 forming a housing for a latch mount release box 662. Latch mount release box 662 includes the two independent latches 663, a release button 673 and a locking spindle 674. Latch mount release box 662 can slide vertically against a spring 659 within rear casing 661. Latches 663 are each biased by a spring 675. Locking spindle 674 engages with the lock rollers 677 of combination lock mechanism 664. When release button 673 is pressed down, latch mount release box 662 slides down against spring 659 causing both latches 663 to move downwards to release hook portions 663a and 667a of latches 663 and pins 667 from one another. If the lock rollers 677 of combination lock mechanism 664 are in a lock position, spindle 674 prevents latch mount release box 662 from moving downward, thus preventing the hook portions 663a and 667a of latches 663 and pins 667 from releasing from one another. As shown in FIG. 16f, hook portions 663a and 667a of latches 663 and pins 667 are preferably rectangular to prevent the hook portions 663a and 667a from turning in locking mechanism 660. However, other non-rotatable shapes could be used. The independent and separately movable latches 663 allow for each end of cable 665 to be secured separately rather than at the same time.

Figure 17C:
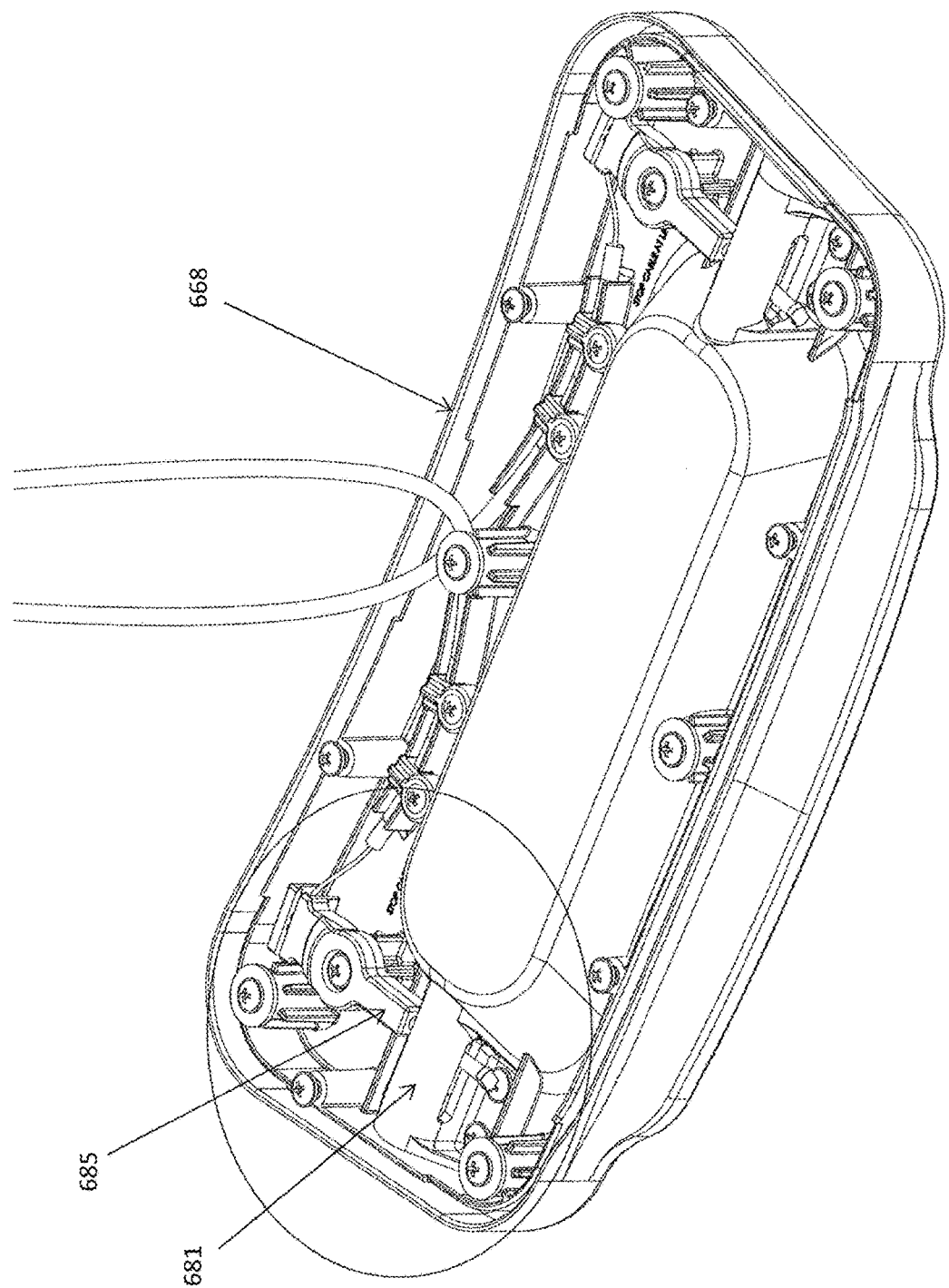
Figure 18A:
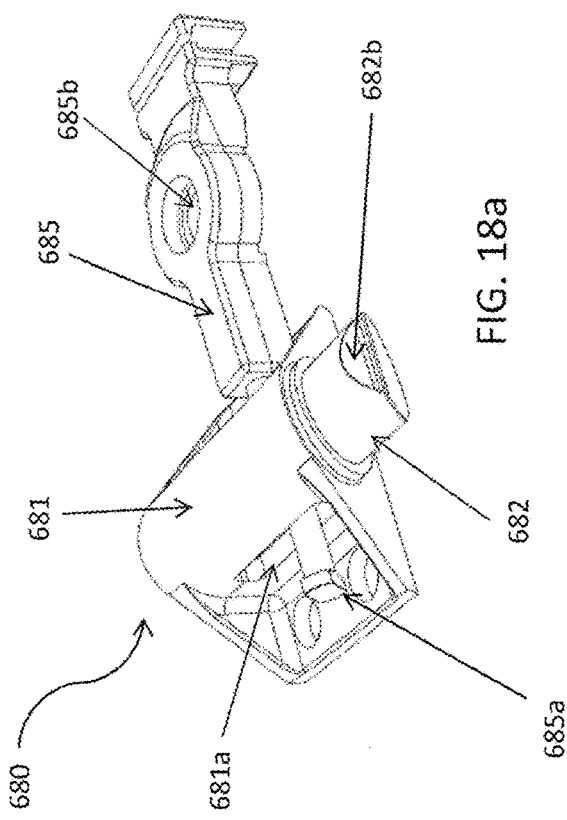
FIG. 18a illustrates a close-up perspective view of the mechanism enabling the engagement and disengagement of the inseparable interaction with a common docking unit.
Figure 18B:
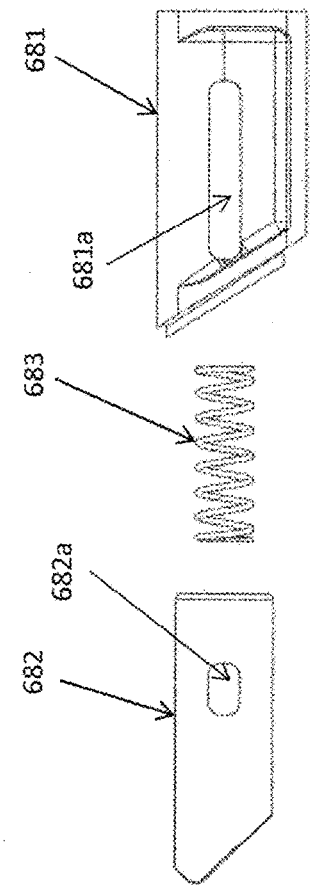
FIG. 18b illustrates a close-up top view of the mechanism enabling the engagement and disengagement of the inseparable interaction with a common docking unit.
Figure 19B:
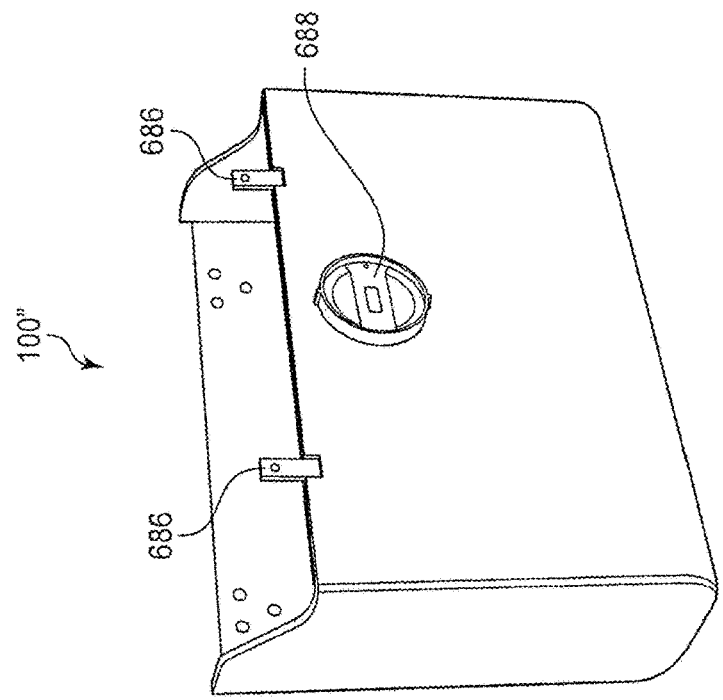
FIG. 19b is a perspective view of the hard portable secure encasement 100" of FIG. 19a without top door 110"
Figure 19A:
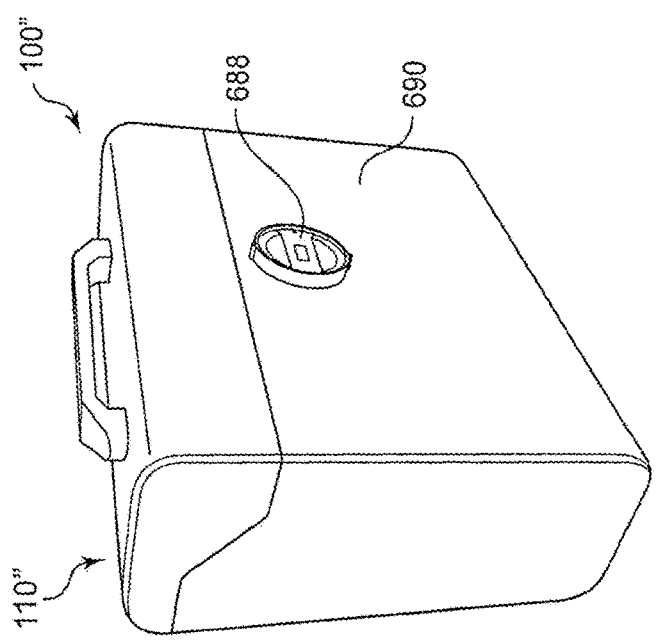
FIG. 19a is a perspective view of another embodiment of a hard portable secure encasement 100"
Figure 20C:
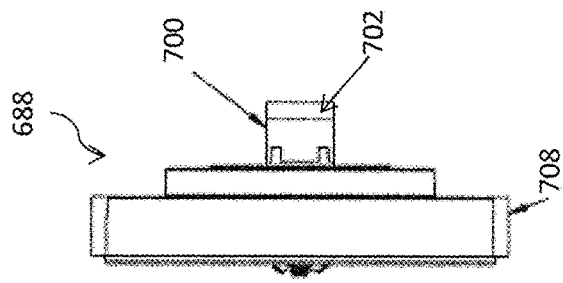
Figure 20B:
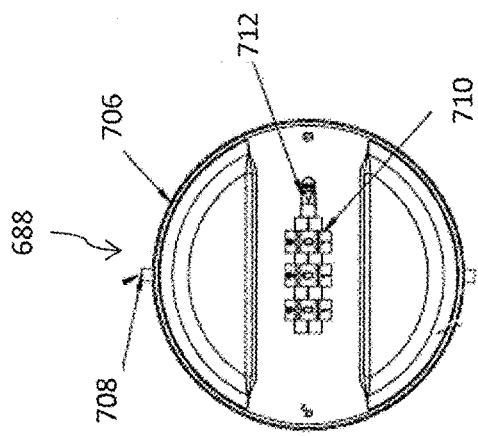
Figure 20A:
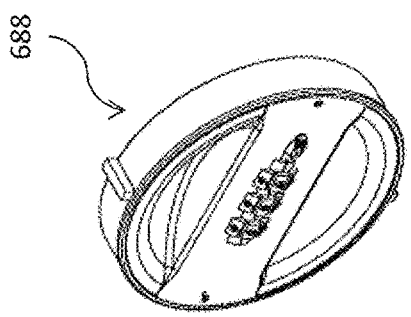
FIG. 20a is a perspective view of the combination lock sub-assembly used in the hard portable secure encasement of FIGS. 19a and 19b.
Figure 21:
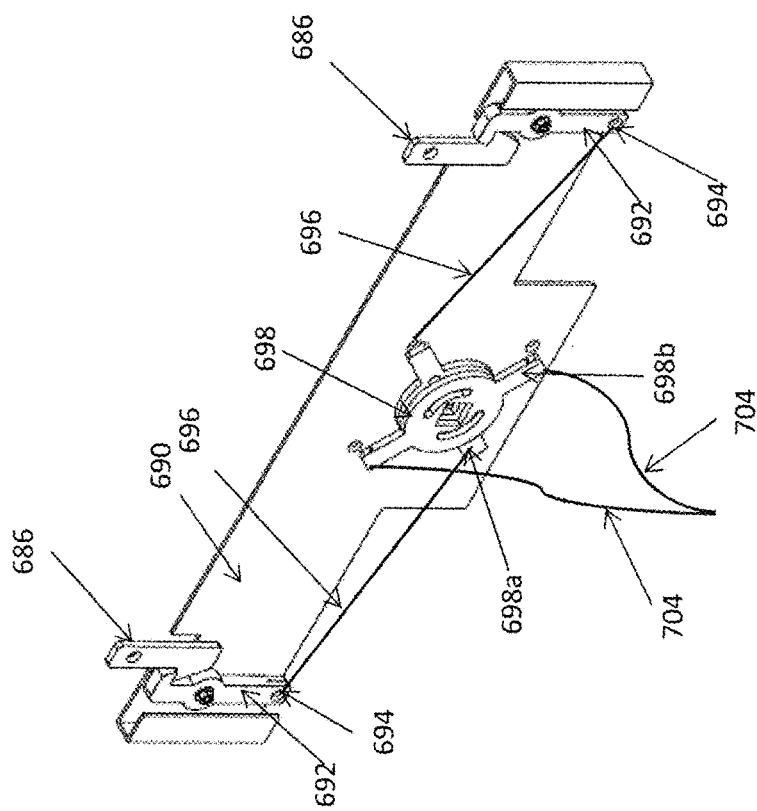
FIG. 21 is a perspective view of the baseplate assembly used in the hard portable secure encasement of FIGS. 19a and 19b.

FIGS. 17a, 17b, 17c and 17d depict the internal mechanism allowing a user to engage and disengage the soft secure portable encasement 600 from a common docking unit. Soft portable secure encasement 600 is capable of inseparably interacting with the common docking unit 200 via an external securement mechanism, for example a male securement mechanism 680 which is shown in FIGS. 17a and 17b from an internal perspective passing through secure base 668 into a portion of the base adapted to receive a common docking unit 669. FIG. 17a provides a cutaway perspective view of a portion of a soft portable secure encasement 600 illustrating the external securement mechanism 680 and its male securement mechanism 681 and disengagement mechanism 695 which is actuated by pull tab 670. Pull tab 670 preferably includes a plastic release bracket 670a (FIG. 16a) to allow the user to use the release bracket as a trigger. The release bracket 670a may include a two-way hoop and loop closure tab fastened over the release bracket 670a to add extra protection against being able to release the release bracket 670a from outside of the encasement. In the embodiments depicted a male type external securement mechanism 680 inseparably interacts with a common docking unit's 200 female type securement mechanism 210 that is received into base portion 669.

According to the various embodiments depicted and referring to FIGS. 17a, 17b, 17c, 17d, 18a and 18b, the external securement mechanism 680 includes a male securement mechanism 681 having a male engagement body 681 biased and telescopically engaged within a male engagement pin 682 by a spring 683 disposed within male engagement body 681. Male engagement body 681 and male engagement pin includes aligned through slots 681a and 682a, respectively. Male engagement pin 682 includes a beveled or angled end 682b. A lever 685 is attached to external securement mechanism 680 and includes a lever arm 685a which is insertable through aligned through slots 681a and 682a to retain male engagement pin 682 correctly aligned within male engagement body 681. Lever 685 further includes a pivot 685b. The male securement mechanism 681 engages with the common docking unit's 200 female type securement mechanism 210, as with the hard secure portable encasement 100 or 100', by applying a downward force to the soft portable secure encasement 600 which causes the angled end 682b of the male engagement pin 682 of securement mechanism 680 to push the external securement mechanism 680 away from the common docking unit against a lever 685 attached to securement mechanism 680, which opposes an applied force provided by the male securement mechanism 681, for example a spring 683, such that once the external securement mechanism 680 passes into the level of the common docking unit's female type securement mechanism 210 the force provided by male securement mechanism 681 causes the external securement mechanism 680 to inseparably interact with the common docking unit 200 until the disengagement mechanism 695 is actuated. To disengage the soft portable secure encasement 600 from the common docking unit 200, a user may pull on a draw tab 670 which conveys a force through the disengagement mechanism 695, for example a cable, to a lever 685 attached to securement mechanism 680, causing lever 685 to pivot about pivot 685b and lever arm 685a to move outwardly within aligned through slots 681a and 682a which pulls the male engagement pin 682 against the applied spring 683 force thereby disengaging the external securement mechanism 680 from the common docking unit 200. As will be appreciated any suitable mechanism may serve as the external securement mechanism 680 such that it enables inseparable interaction between the soft portable secure encasement 600 and the common docking unit 200.

Referring to FIGS. 19a, 19b, 20a, 20b, 20c and 21, an alternative embodiment of a hard portable secure encasement 100" is shown. According to the depicted embodiment, hard portable secure encasement 100" includes a top door or lid 110". A pair spaced apart of lid latches 686 are attached to and extend downwardly from a front portion of lid 110". A combination lock sub-assembly 688 is mounted to the exterior of front side wall 690 of the hard portable secure encasement 100". A baseplate 690 is attached to the interior of front side wall 690. A pair spaced apart of spring loaded lid latches receivers 692 are attached to and extend upwardly from baseplate 690. Spring loaded lid latches receivers 692 are attached to the baseplate 690 so that they can rotate and are spring loaded so that their normal position is vertical. A lid release rotating lever assembly 698 having a lid release rotating lever 698a and a dock release rotating lever 698b is mounted in the baseplate 690 and configured to rotate 90 degrees clockwise. Lid release rotating lever 698a and dock release rotating lever 698b rotate in separate planes. The plane of dock release rotating lever 698b is further away from baseplate 690 than lid release routing lever 698a. Holes 694 in each of the lower end of the latch receivers 692 are connected via wire cables 696 to lid release rotating lever 698a. Combination lock sub-assembly 688 and baseplate 690 are mounted so that the center of combination lock sub-assembly 688 is concentric with lid release rotating lever assembly 698.

Combination lock sub-assembly 688 includes a spindle 700 having a square portion 702 on one end. Combination lock sub-assembly 688 can slide a short distance (5 mm) towards or away from the baseplate 690 in order to engage (via square 702 on the end of spindle 700) with either the lid release rotating lever 698a (when combination lock sub-assembly 688 is pulled out) or the dock release rotating lever 698b (when combination lock sub-assembly 688 is pushed in).

When combination lock sub-assembly 688 is pushed in and rotated 90 degrees clockwise it engages dock release rotating lever 698b (because the plane of dock release rotating lever 698b is farther away from baseplate 690 than the plane of lid release rotating lever 698a) which causes two male securement mechanisms located in the base of hard portable secure encasement 100" such as those shown in earlier figures to retract and release the hard portable secure encasement 100" from a common docking unit via dock release cables 704 operatively connected between the dock release rotating lever 698b and the two male securement mechanisms. Thus, the same combination lock sub-assembly 688 can be used to either open the encasement or undock the encasement depending on whether the lock is in the outward or inward position on the from of the encasement. There are four ball bearings located between the two release rotating levers to allow relative movement between the levers and these are housed in holes in the lid release rotating lever 698a but free to rotate on the surface of the dock release totaling lever 698b. Combination lock sub-assembly 688 further includes a casing 706 and runners 708 disposed on the casing. The runners 708 prevent the lock casing 706 from rotating while being pushed in or pulled out. Combination lock sub-assembly 688 further includes a combination dial 710 and reset button 712.

This embodiment allows a combination lock that is capable of giving the user the option of unlocking the encasement or undocking the encasement by either pushing or pulling the combination lock sub-assembly. The user needs only one combination to open the combination lock sub-assembly and the combination lock sub-assembly will only rotate 90 degrees clockwise from its normal position so whichever function is required the motion is the same: turn the combination to the horizontal position and either pull or push before turning 90 degrees clockwise to operate both functions.

Figure 22:
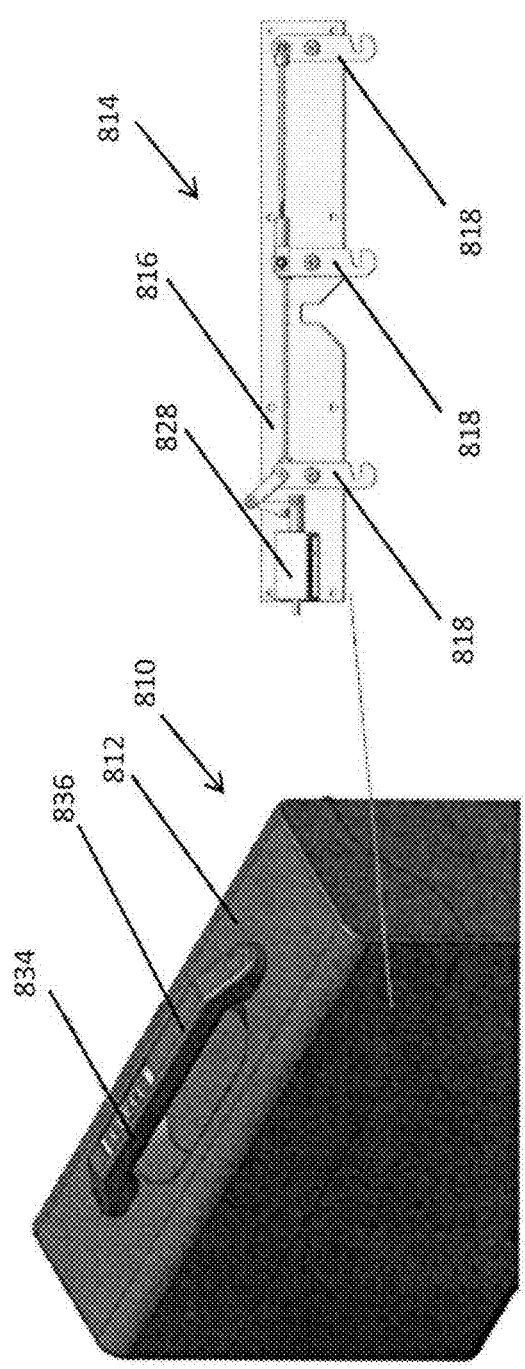
FIG. 22 shows an isometric view of an encasement and the location of the multi-point locking system according to embodiments of the invention.
Figure 23:
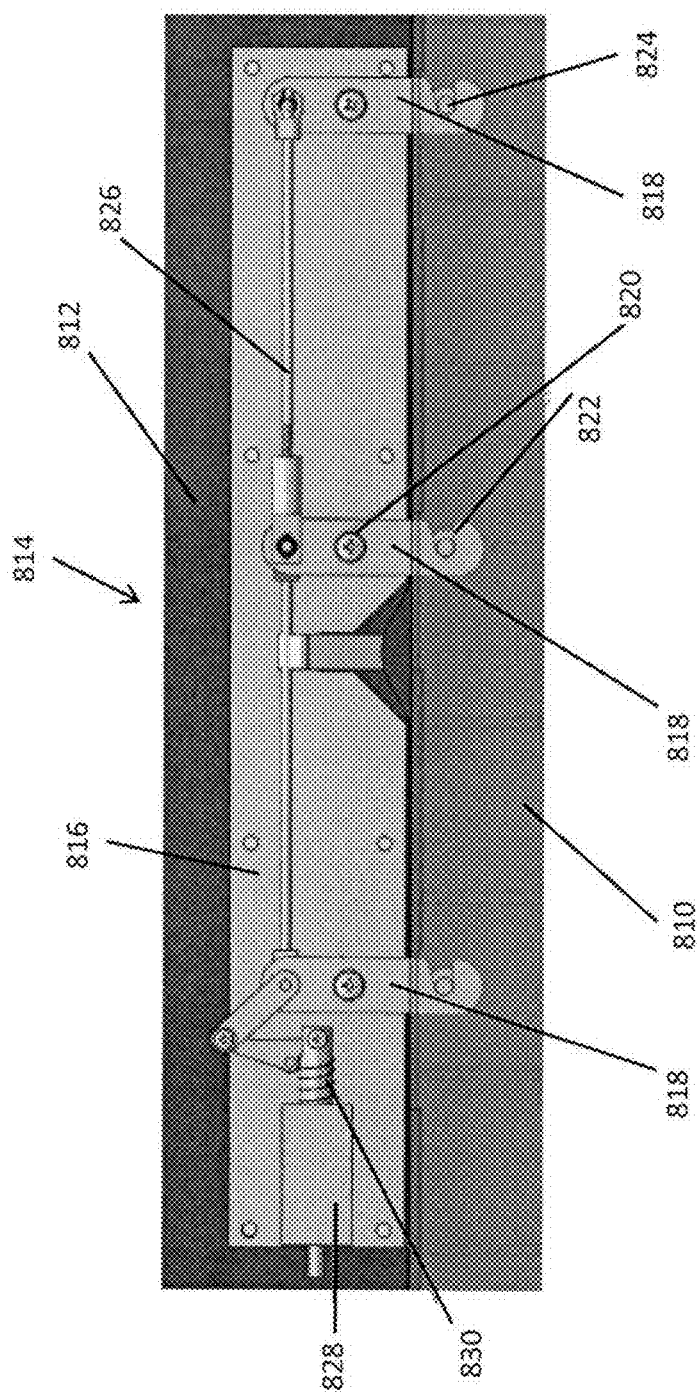
FIG. 23 shows a front view of the multi-point locking system in a locked position.
Figure 26:
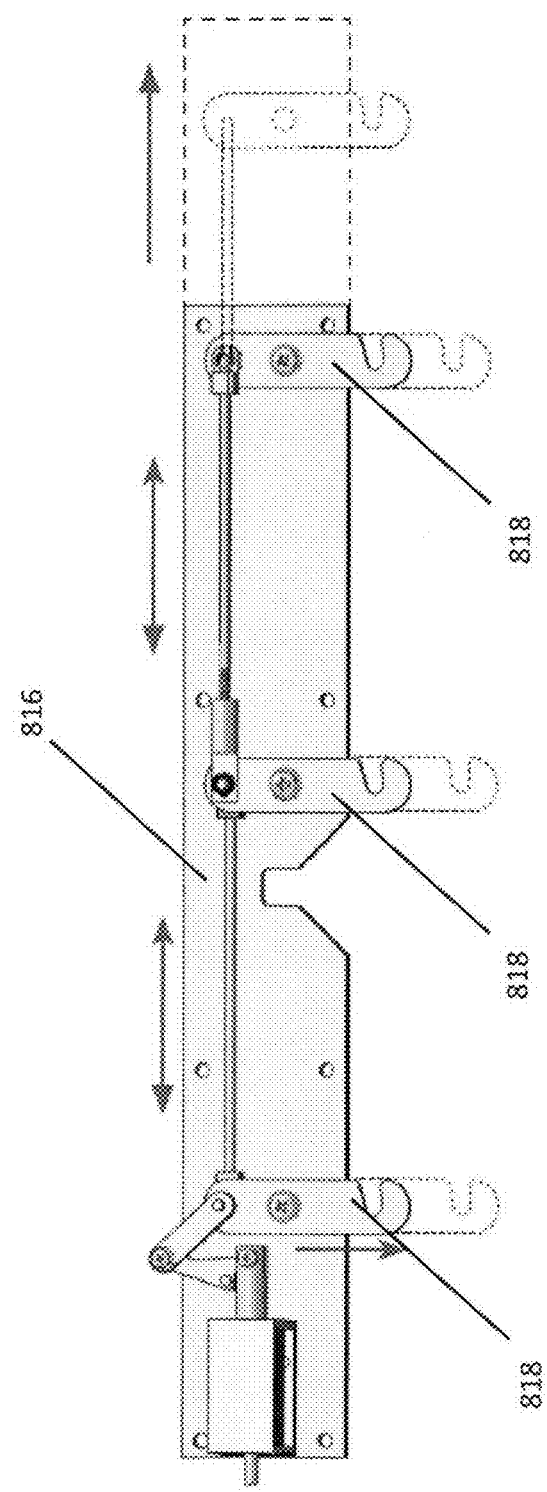
FIG. 26 shows a front view of the length adjustment feature of the multi-point locking system.

With reference to FIGS. 22-26, a hard encasement 810 includes a top door or lid 812. There is a locking mechanism 814 having a baseplate 816 attached to the interior of the lid 812. Baseplate 816 has multiple retractable arms 818 which are each pivotally attached to baseplate 816 by pivots 820 at a midpoint of the arm 818. Each arm 818 has a groove 822 on a distal end of the arm 818 for releasable engagement with a knob 824 on the body of the encasement 810. The proximal end 818 of each arm 818 is pivotally attached to a control arm, bar or horizontal wire 826 which is operatively connected to at least one solenoid 828 to control the position of the horizontal wire 826 which then causes the arms 818 to pivot to releasably engage knobs 824. The at least one solenoid 828 includes a spring 830 which forces the arms 818 into a locked position (FIG. 23). When solenoid 828 is not energized, locking mechanism 814 is held in the locked position by the spring force of spring 830. When compressed, spring 830 allows arms 818 to move to an unlocked position (FIG. 24). Once opened, a spring catch 832 (FIG. 25A) stops arms 818 from returning to the locked position while lid 812 is opened. When closed (FIG. 25C), spring catch 832 is released allowing arms 818 to move back into the locked position to secure lid 812. Referring to FIG. 26, the length of the locking mechanism may be adjusted and the number of arms 818 may be increased to fit different sizes of encasements 810.

Referring to FIG. 22, encasement 810 includes a digital lock 834 on a handle 836 disposed on lid 812. Digital lock 834 is wired to two sets of solenoids in the base and in the lid through a selector switch in the handle 836. When the switch is set to DOCK, entering the code and pressing OK releases encasement 810 from the dock (not shown) by energizing the solenoids in the base that pull the locking pins back against the springs (not shown). When the switch is set to LOCK, entering the code and pressing OK causes the solenoid 828 in the lid to pull the horizontal wire 826 and release the locking arms 818 simultaneously.

Solenoid 828 only receives momentary energy and once it is de-energized, the spring catch 832 stops the mechanism from returning to the locked position. In this way, encasement 810 remains open until the user deliberately locks it again. This obviates the need for the user to enter the unlocking code every time they open encasement 810.

An embodiment in this application further includes an alternative system (not shown) for opening encasement 810 in the event of failure of solenoid 828 or if for some reason electric digital lock 834 fails. This backdoor system involves a mechanical operated cylinder in which a key turns the barrel in the lock and a lever attached to the barrel can push or pull arm 826 which is normally operated by solenoid 828. This backdoor system may be hidden behind the label or under a breakaway piece of plastic so that it is not readily apparent. This has the beneficial application in case of failure of solenoid 828 and it is in, for example, a rental car. The rental car company could then remove the encasement 810. A master key would only be made available to top management/security at companies including banks and other financial service corporations. Government agencies would likely require this for their own encasements and the key cylinders can be either standard or very expensive. The more expensive the harder to pick.

Solenoid 828 may be replaced by, for example, a stepper motor that moves the horizontal arm by a lead-screw or other such mechanism. Solenoid 828 may also be replaced with an electromagnet or other mechanical activator such as a cable system with a trigger in the handle.

Figure 27A:
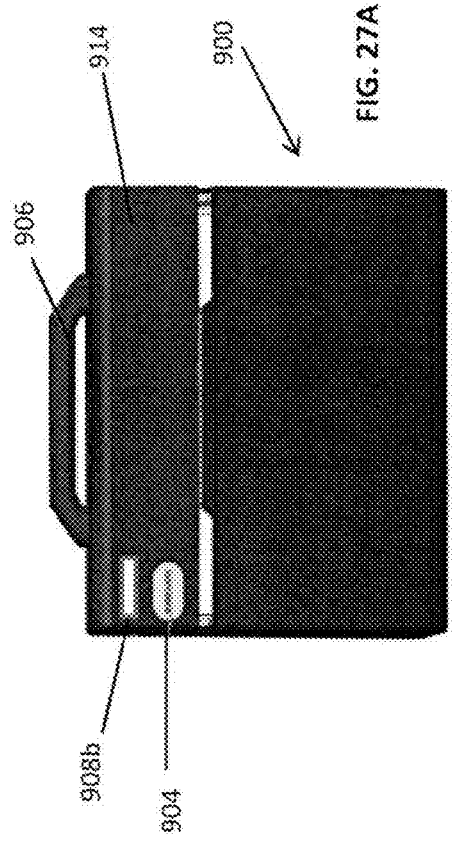
FIG. 27A shows a front view of the multi-point locking according to an alternative embodiment.
Figure 27B:
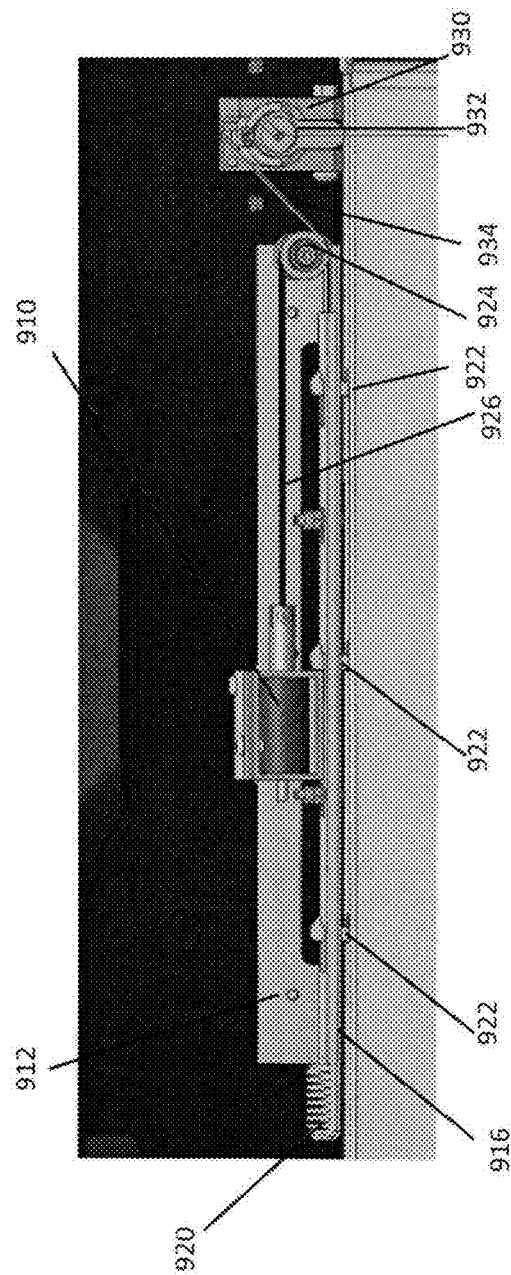
FIG. 27B shows a front view of the multi-point locking system in a locked position according to the alternative embodiment.
Figure 28A:
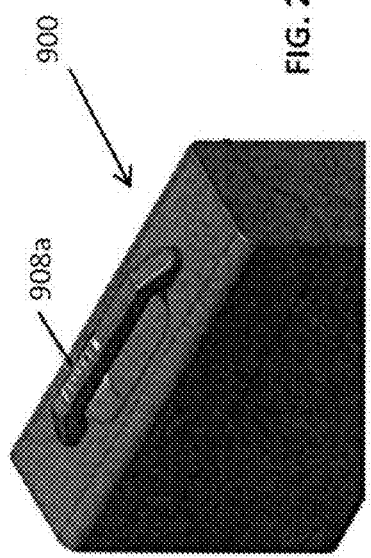
FIG. 28A shows an isometric view of an encasement with a multi-point locking system according to the alternative embodiment.

Referring to FIGS. 27A to 38, an alternate embodiment of an encasement 900 with a multi-point locking system 902 is shown. As shown in FIG. 27A, the encasement includes an override lock cover 904, and a handle 906 which includes an input locking mechanism such as an input pad 908a mounted on handle 906 (FIG. 28A) or input pad 908b mounted on lid 914 for entering a code to activate a solenoid 910 or other actuator mechanism of the multi-point locking system 902. As shown in FIG. 27B, the multi-point locking system 902 includes a solenoid 910 attached to a frame 912 mounted in the interior of the lid 914 of the encasement 900. An elongated platform 916 having spaced through-holes 918 is mounted for relative movement with the frame 912 and lid 914 and spring-biased against a coiled spring 920 mounted to the frame 912 on one end of the platform 916. The though-holes 918 releasably cooperate with spaced locking projections such as hook-shaped static tabs 922 (FIG. 29C) upwardly projecting from the front side wall of the encasement 900. The hook-shaped static tabs 922 may be integral with a tab frame 923 which is mounted to the front side wall of the encasement 900. A pulley 924 is mounted on the frame 912 such that a wound cord 926 is operatively connected between the frame 912 and the platform 916 by way of the pulley 924.

Figure 28B:
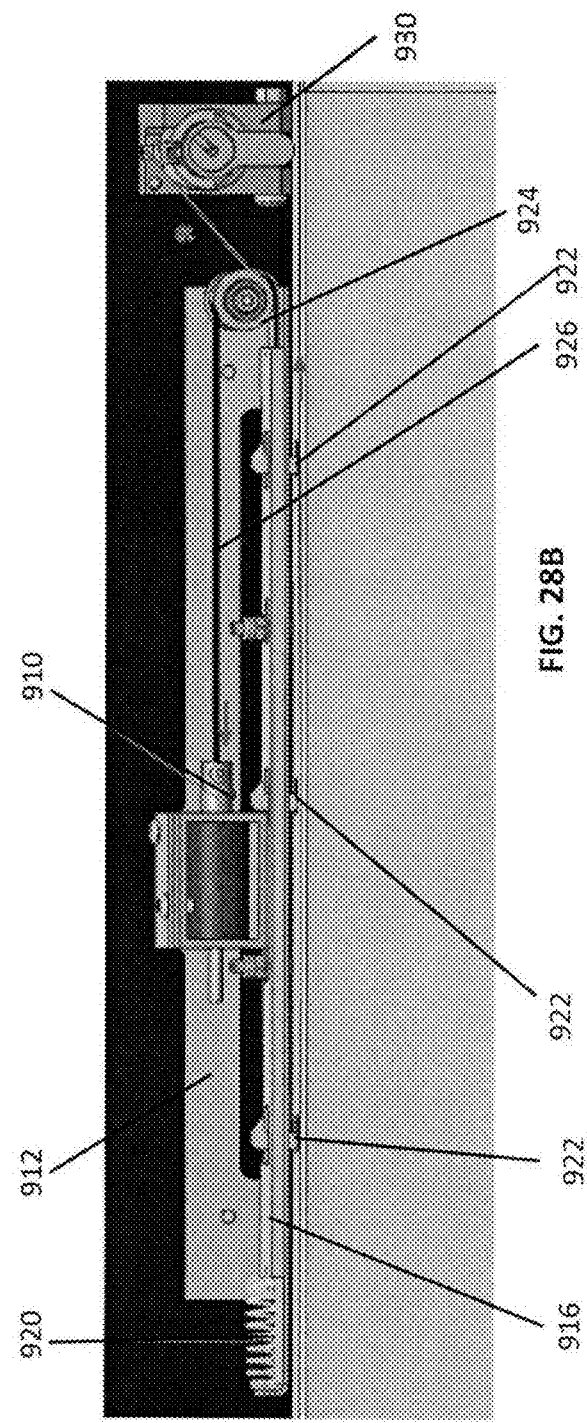
FIG. 28B shows a front view of the multi-point locking system in an un-locked position according to the alternative embodiment.

When the solenoid 910 is activated, the cord 926 causes the platform 916 to move between a locked position (FIG. 27B) and an unlocked position (FIG. 28B). FIG. 27B shows the multi-point locking system 902 in a locked position in which the coiled spring 920 is compressed when the solenoid 910 is neutral. The hooked portion 928 of the static tabs 922 hooks over the edge of the through-holes 918 on the platform 916 locking the lid 914 in place.

As shown in FIG. 28B, once the solenoid 910 is activated by entering the activation code on the encasement handle 906, the solenoid 910 pulls the lock platform 916 to release the locked tabs 922 thereby stretching the coiled spring 920. In this unlocked position shown in FIG. 28B, the hooked portion 928 of the static tabs 922 is free to move within the through-holes 918 on the platform 916 thereby unlocking the lid 914.

Referring to FIGS. 29A to 29C, once the encasement 900 is opened and the static tabs 922 are no longer in the through-holes 918, the solenoid 910 returns to the relaxed/neutral position and the coiled spring 920 returns to the compressed state.

Figures 30A, 30B:
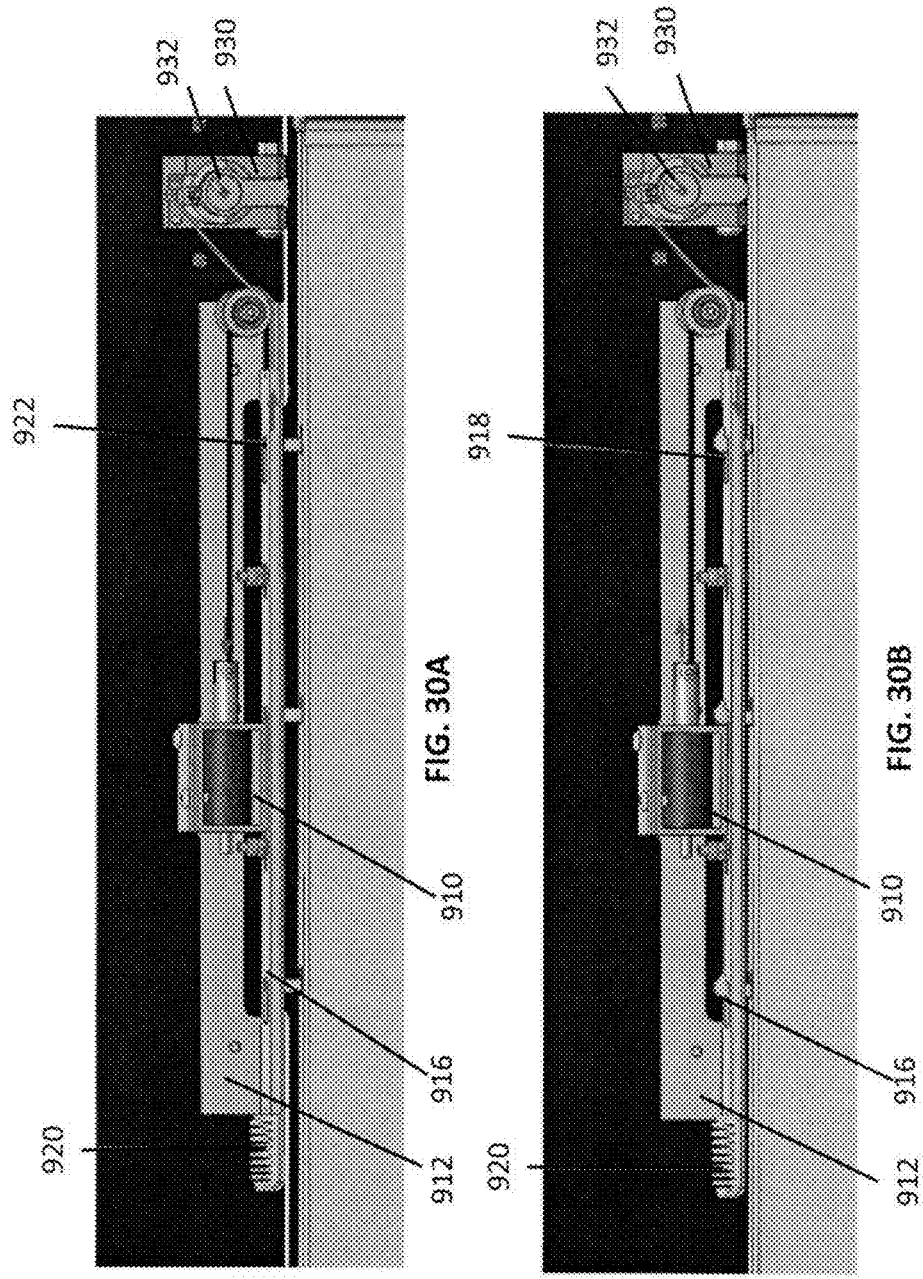
FIG. 30A shows a front view of the multi-point locking system while closing according 10 the alternative embodiment.
FIG. 30B shows a front view of the multi-point locking system while locking according to the alternative embodiment.
Figure 31:
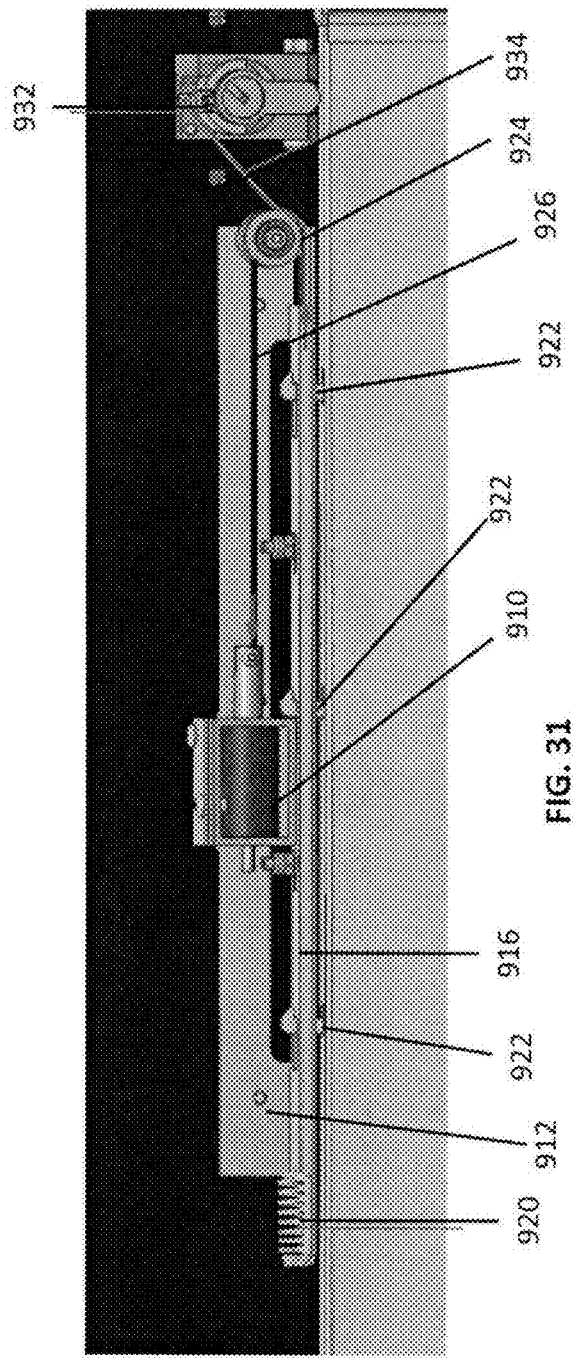
FIG. 31 shows a front view of the multi-point locking system including the override locking system according to the alternative embodiment.
Figure 32:
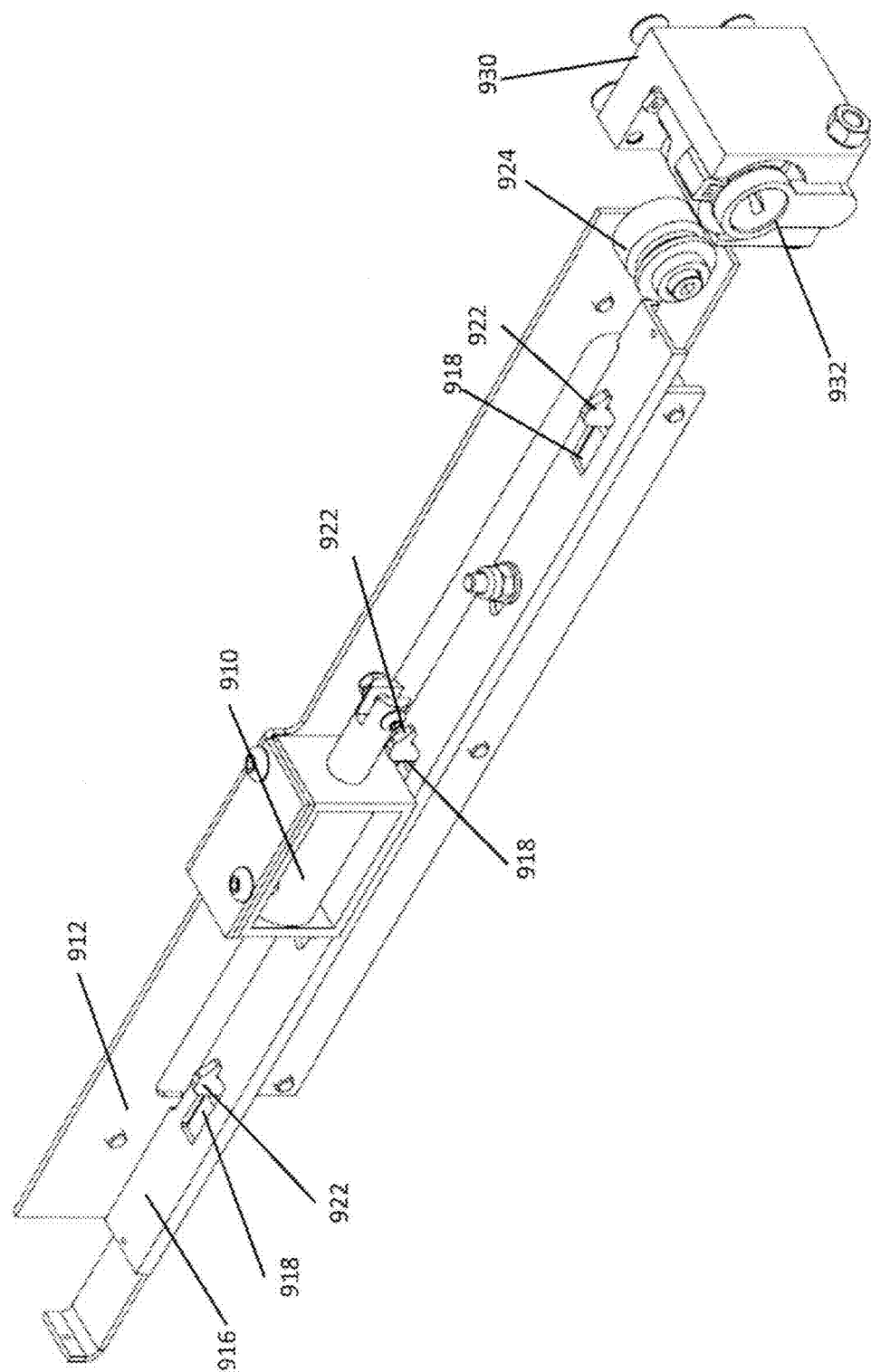
FIG. 32 shows an isometric view of the multi-point locking system according to the alternative embodiment.
Figure 33:
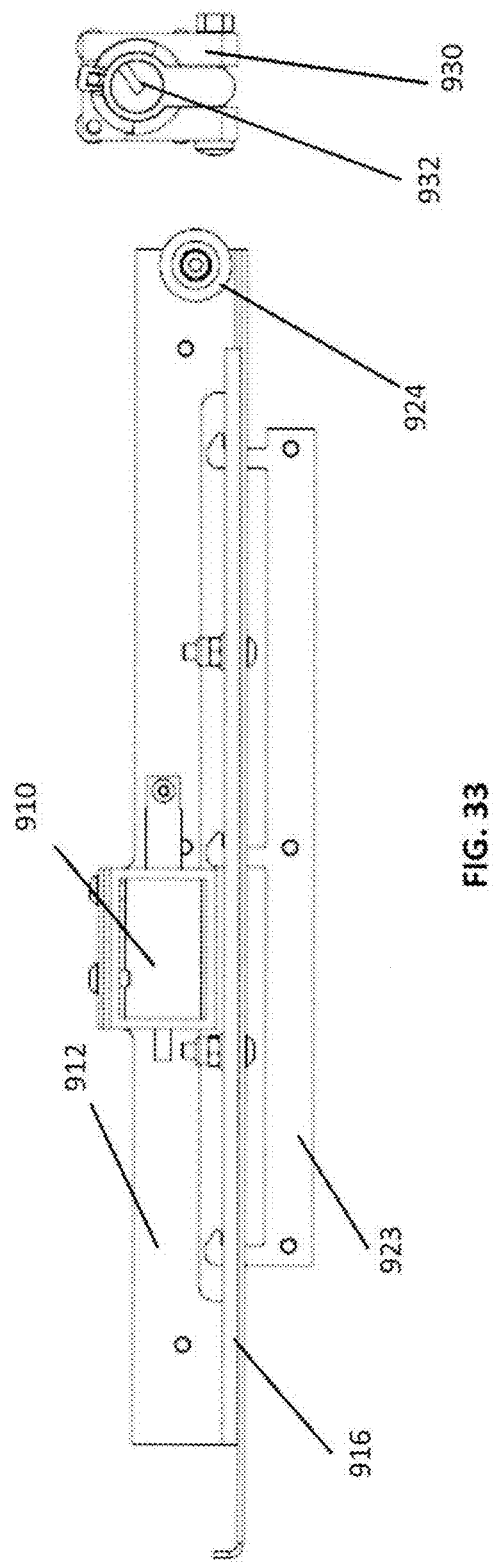
FIG. 33 shows a front view of the multi-point locking system according to the alternative embodiment.
Figure 34:
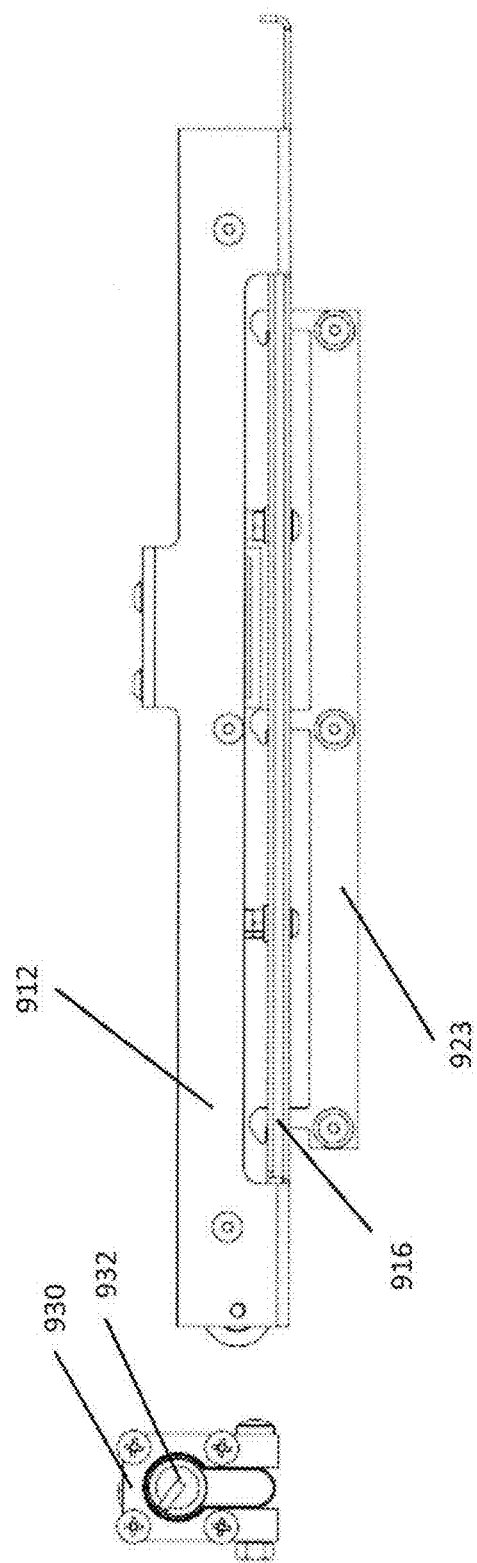
FIG. 34 shows a rear view of the multi-point locking system according to the alternative embodiment.
Figure 35:
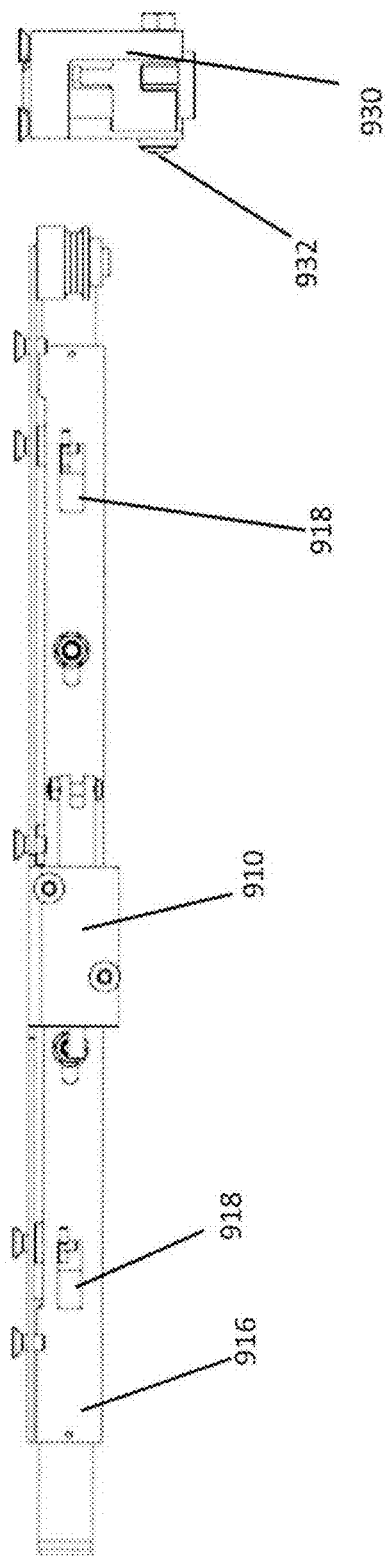
FIG. 35 shows a top view of the multi-point locking system according to the alternative embodiment.
Figure 36:
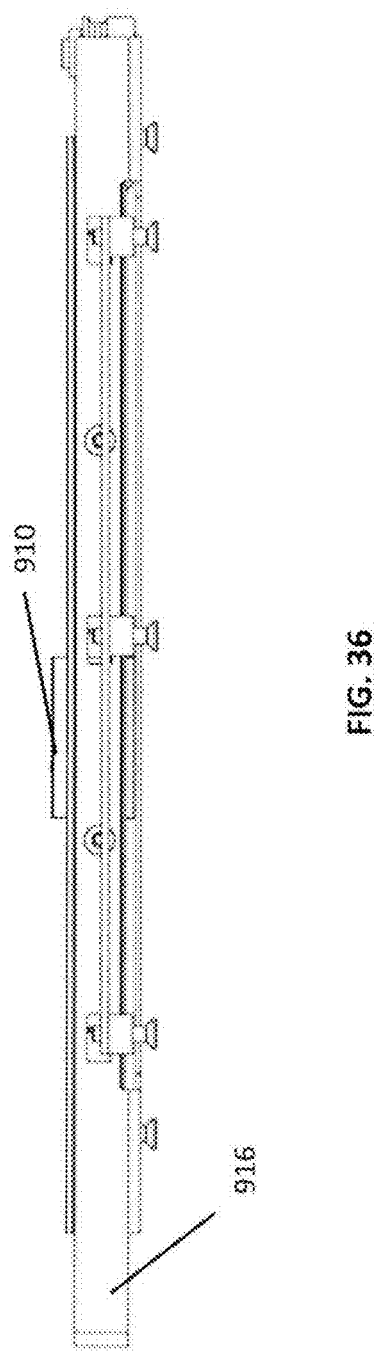
FIG. 36 shows a bottom view of the multi-point locking system according to the alternative embodiment.

As shown in FIG. 30A, the coiled spring 920 expands while the platform 916 slides to the right when closing by following the angle of the static tabs 922. As shown in FIG. 30B, once the tabs 922 have entered the through-holes 918, the platform 916 slides back to the resting position thereby locking the tabs 922 in place and locking the lid 914 while the coiled spring 920 compresses.

The alternative embodiment further includes an override system 930. In the override system 930, a key (not shown) opens the encasement 900 with an override lock 932 mounted within the lid 914 which will release and retract a second wound cord 934 operatively connected to the platform 916 around pulley 924 to expand the coiled spring 920 and release the static tabs 922 to allow the encasement 900 to be opened. The override lock 932 is accessed through the override lock cover 904 (FIG. 27A).

Referring to FIGS. 39A and 39B, an alternate embodiment of the override system 936 is shown. In this embodiment, the override lock 938 has a rotatable radial projection 940 which turns when the key (nor shown) is turned. When the key is turned, projection 940 engages a projection 942 on platform 916 to move platform 916 between a locked position (FIG. 39A) and an unlocked position (FIG. 39B) as discussed above.

Throughout the disclosed embodiments, the principal objective is foremost of providing the traveler with an overall security system, where he or she will be able to hand carry their traveling valuables, or he or she will be able to temporarily secure them to common docking units affixed to strongly mountable surfaces, all via the portable secure encasements disclosed, which always in its securement, conceals the contents carried by the traveler within the encasement. Such common docking units may be provided at and by the traveling facilities, i.e. the rental cars, hotel rooms, airports, parks, beaches, etc., so the traveler will be able to complete a trip without the danger of being successfully robbed by a thief or attacker, whose objective is to wrongfully obtain, money, jewelry, keys, cameras, lenses, credit cards, travelers' checks, airline tickets, etc. These security advantages may also be realized in and about a person's home, office, or business, and/or nearby daily undertakings, when such selected often used valuables may be secured from loss by local thieves.

Although the invention has been described in terms of particular embodiments in this application, one of ordinary skill in the art, in light of the teachings herein, can generate additional embodiments and modifications without departing from the spirit of, or exceeding the scope of, the described invention. Accordingly, it is understood that the drawings and the descriptions herein are proffered only to facilitate comprehension of the invention and should not be construed to limit the scope thereof. Modifications and variations can be made to the present security assembly without departing from the spirit and scope of the invention as defined by the following claims or their equivalents. Hence, unless changes otherwise depart from the scope of the invention, the changes should be construed us being included herein.

What is claimed is:

1. A locking system for an encasement comprising:

a platform configured to be mounted to an interior of a lid of the encasement, and having at least one through-hole, at least one locking projection mounted to an interior of a body of the encasement;

wherein each of the at least one through-hole is configured to receive a corresponding at least one locking projection; and at least one actuator configured to be operatively mounted to the interior of the lid;

wherein the platform is operatively connected for movement relative to the lid and the locking projections between a locked position and an unlocked position;

wherein the at least one actuator is operatively connected to the platform and is configured to move the platform relative to the lid and the locking projections between the locked position and the unlocked position; and further comprising:

an input locking mechanism mounted on the encasement configured to activate the at least one actuator;

a frame mounted to the interior of the lid, wherein the at least one actuator is mounted to the frame;

a spring mounted to the frame and configured to be operatively connected to a first end of the platform; wherein the at least one actuator is at least one solenoid, and wherein the platform is configured for movement by the at least one solenoid against the spring, and wherein the spring is compressed by the platform when in the locked position;

a pulley mounted to the frame, and further comprising a first cord operatively connected between the at least one solenoid and the platform by way of the pulley;

an override system including an override lock operatively mounted to the lid, wherein the override lock is configured to be moved between an override lock position and an override unlocked position; and a second cord operatively connected between the override lock and the platform by way of the pulley, wherein the second cord is configured to move the platform to the unlocked position to expand the spring when the override lock is in the override unlocked position.

2. The locking system of claim 1, wherein the at least one through-hole is a plurality of through-holes; and wherein the at least one locking projection is a plurality of locking projections.

3. The locking system of claim 2, wherein each of the plurality of locking projections comprises a hook-shaped static tab having a hook portion which is configured to hook over an edge of a corresponding through-hole when the platform is in the locked position.

4. The locking system of claim 1, wherein the input locking mechanism is an input pad configured to receive an unlock code to activate the at least one actuator.

5. The locking system of claim 4, wherein the input pad is mounted on the lid.

6. The locking system of claim 4, further comprising a handle on the encasement, wherein the input pad is mounted on the handle.

7. The locking system of claim 1, further comprising a rotatable projection radially projecting from the override lock, and further comprising a projection on the platform; wherein the rotatable projection is configured to engage the projection on the platform to move the platform to the unlocked position to expand the spring when the override lock is in the override unlocked position.

8. The locking system of claim 1, further comprising an override lock cover on the encasement configured to allow access to the override lock.

* * * * *